(12) United States Patent
Daughton et al.

(10) Patent No.: US 6,404,191 B2
(45) Date of Patent: Jun. 11, 2002

(54) READ HEADS IN PLANAR MONOLITHIC INTEGRATED CIRCUIT CHIPS

(75) Inventors: James M. Daughton, Eden Prairie, MN (US); Arthur V. Pohm, Ames, IA (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 09/814,637

(22) Filed: Mar. 22, 2001

Related U.S. Application Data

(63) Continuation-in-part of application No. 08/907,561, filed on Aug. 8, 1997.
(60) Provisional application No. 60/191,209, filed on Mar. 22, 2000.

(51) Int. Cl.$^7$ .......................... G11B 5/127; G01R 33/02
(52) U.S. Cl. ................... 324/252; 324/207.21; 360/103
(58) Field of Search ............................. 324/252, 207.21; 360/103, 104, 113

(56) References Cited

U.S. PATENT DOCUMENTS

| | | | | |
|---|---|---|---|---|
| 4,504,880 A | | 3/1985 | Church et al. ............... 360/113 |
| 4,967,298 A | * | 10/1990 | Mowry ........................ 360/113 |
| 5,075,956 A | | 12/1991 | Das .............................. 29/603 |
| 5,212,611 A | | 5/1993 | Dee ............................. 360/113 |
| 5,335,127 A | * | 8/1994 | Nagata et al. ............... 360/113 |
| 5,341,118 A | * | 8/1994 | Parkin et al. ............ 324/252 X |
| 5,366,815 A | | 11/1994 | Araki et al. ................. 428/611 |
| 5,390,061 A | * | 2/1995 | Nakatani et al. ............ 360/113 |
| 5,408,377 A | * | 4/1995 | Gurney et al. .......... 324/252 X |
| RE35,228 E | * | 5/1996 | Mowry et al. ............... 360/126 |
| 5,569,544 A | | 10/1996 | Daughton .................... 428/611 |
| 5,617,071 A | | 4/1997 | Daughton ................. 338/32 R |
| 5,708,358 A | * | 1/1998 | Ravipati ...................... 324/252 |
| 5,742,458 A | * | 4/1998 | Koike et al. ............. 324/252 X |
| 5,750,275 A | | 5/1998 | Katz et al. ............... 428/694 R |
| 5,822,153 A | * | 10/1998 | Lairson et al. ............... 360/104 |
| 5,926,348 A | | 7/1999 | Shouji et al. ................ 360/113 |
| 5,949,622 A | * | 9/1999 | Kamaguchi et al. ........ 360/113 |
| 5,995,338 A | | 11/1999 | Watanabe et al. ........... 360/113 |
| 6,001,468 A | | 12/1999 | Tagawa ....................... 428/332 |
| 6,040,961 A | | 3/2000 | Gill ............................. 360/113 |
| 6,061,211 A | * | 5/2000 | Yoda et al. .................. 360/113 |
| 6,111,722 A | | 8/2000 | Fukuzawa et al. .......... 360/113 |
| 6,120,919 A | * | 9/2000 | Shigematsu et al. ........ 428/692 |

OTHER PUBLICATIONS

Article: "Sensitivity of Orthogonal Magnetoresistive Heads" by Wang et al., *IEEE Transactions on Magnetics*, vol. 29, No. 6, Nov. 1993; pp. 3820–3822.

Article: "Narrow End–On Giant Magnetoresistance READ–Head Sensors" by Pohm et al., *IEEE Transactions on Magnetics*, vol. 33, No. 3, May 1997; pp. 2392–2396.

* cited by examiner

*Primary Examiner*—Safet Metjahic
*Assistant Examiner*—T. R. Sundaram
(74) *Attorney, Agent, or Firm*—Kinney & Lange, P.A.

(57) ABSTRACT

A plurality of magnetic field sensing structures in a monolithic integrated circuit chip structure to provide output signals at outputs thereof of magnetic field changes provided therein from corresponding sources having poled pair structures with a gap space between them with adjacent ones of the magnetic field sensing structures that are interconnected with a circuit formed in the monolithic integrated circuit chip such as an amplifier. The paired pole structures may intersect a surface of the chip perpendicular to the major surfaces thereof or in one of, or a surface parallel to, the major surfaces thereof. A magnetic field generating structure may also be included in the chip.

35 Claims, 23 Drawing Sheets

READ HEADS IN PLANAR MONOLITHIC INTEGRATED CIRCUIT CHIPS

CROSS-REFERENCE TO RELATED APPLICATIONS

This application is a continuation-in-part of application Ser. No. 08/907,561, filed Aug. 8, 1997, entitled "Magnetic Field Sensor", and claims priority from Provisional Application No. 60/191,209, filed Mar. 22, 2000, entitled "Read Heads in Planar Monolithic Integrated Circuit Chips".

BACKGROUND OF THE INVENTION

Digital data magnetic recording systems store digital data by recording same in a moving magnetic media layer using a storage, or "write", electrical current-to-magnetic field transducer, or "head", positioned immediately adjacent thereto. The data is stored or written to the magnetic media by switching the direction of flow in an otherwise substantially constant magnitude write current that is established in coil windings in the write transducer in accordance with the data. Each write current direction transition results in a reversal of the magnetization direction, in that portion of the magnetic media just then passing by the transducer during this directional switching of the current flow, with respect to the magnetization direction in that media induced by the previous in the opposite direction.

Recovery of such recorded digital data is accomplished through positioning a retrieval, or "read" magnetic field-to-voltage transducer, or "head", to have the magnetic media, containing previously stored data, pass thereby. Such passing by of the media adjacent to the transducer permits the flux accompanying the magnetization reversal regions in that media either to induce a corresponding voltage pulse in forming an analog output read signal for that retrieval transducer or, alternatively, change a transducer circuit parameter based on magnetoresistive sensing of magnetic conditions therein to thereby provide such an output signal voltage pulse.

Such transducers or sensors can often be advantageously fabricated using ferromagnetic thin-film materials. Ferromagnetic thin-film sensors can be made very small when so constructed. Such sensors are often provided in the form of an intermediate separating material having two major surfaces on each of which an anisotropic ferromagnetic thin-film is provided. In such "sandwich" structures, reducing the thickness of the ferromagnetic thin-films in the intermediate layer has been shown to lead to a "giant magnetoresistive effect" being present for an electrically conductive material intermediate layer or a "spin dependent tunneling effect" being present for an electrically insulative material intermediate layer. This effect can be enhanced by having additional alternating ones of such films and layers, i.e. superlattices. This effect can yield a magnetoresistive response which can be in the range of up to an order of magnitude greater than that due to the well-known anisotropic magnetoresistive response.

In the ordinary anisotropic magnetoresistive response in ferromagnetic thin-films, varying differences between the direction of the magnetization vector in such a thin-film and the direction of a sensing current passed through that film in turn lead to varying differences in the effective electrical resistance of the film in the direction of the current. The maximum electrical resistance occurs when the magnetization vector in the film and the current direction are parallel to one another, while the minimum resistance occurs when they are perpendicular to one another. The total electrical resistance of such a magnetoresistive ferromagnetic thin-film exhibiting this response can be shown to be given by a constant value, representing the minimum resistance present, plus an additional value depending on the angle between the current direction in the film and the magnetization vector therein. This additional resistance follows a square of the cosine of that angle.

As a result, external magnetic fields supplied for operating a film sensor of this sort can be used to vary the angle of the magnetization vector in such a film portion with respect to the easy axis of that film portion. This axis exists in the film because of an anisotropy present therein typically resulting from depositing the film in the presence of an externally supplied magnetic field during deposition of the film that is oriented in the plane of the film along the direction desired for the easy axis in the resulting film. During subsequent operation of a sensing device using this resulting film, such externally supplied magnetic fields for operating the film sensor can vary the magnetization vector angle to such an extent as to cause switching of that film's magnetization vector between two stable states which occur as magnetizations oriented in opposite directions along the established easy axis. The state of the magnetization vector in such a film portion can be measured, or sensed, by the change in resistance encountered by a current directed through this film portion.

In contrast to this arrangement, resistance in the plane of either of the ferromagnetic thin-films in the "sandwich" structure is isotropic with respect to the giant magnetoresistive effect rather than depending on the direction of a sensing current therethrough as for the anisotropic magnetoresistive effect. The giant magnetoresistive effect has a magnetization dependent component to resistance that varies as the cosine of the angle between the magnetizations in the two ferromagnetic thin-films on either side of the intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. oriented in opposing directions. Further, the anisotropic magnetoresistive effect in very thin films is considerably reduced from the bulk values therefor in thicker films due to surface scattering, whereas very thin films are a fundamental requirement to obtain a significant giant magnetoresistive effect. The total electrical resistance in such a magnetoresistive ferromagnetic thin-film "sandwich" structure can be shown again to be given by a constant value, representing the minimum resistance present, plus an additional value depending on the angle between the magnetization vectors and the two films as indicated above.

Another magnetic field sensor suited for fabrication with dimensions of a few microns or less can be fabricated that provides a suitable response to the presence of external magnetic fields and low power dissipation by substituting an electrical insulator for a conductor in the nonmagnetic layer. This sensor can be fabricated using ferromagnetic thin-film materials of similar or different kinds in each of the outer magnetic films provided in a "sandwich" structure on either side of an intermediate nonmagnetic layer which ferromagnetic films maybe composite films, but this insulating intermediate nonmagnetic layer conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a sensor, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

One common magnetic field sensing situation is the sensing of magnetization changes along a data recording track selected from many such tracks in the magnetic media of a magnetic data storage system. As these tracks are made narrower and narrower to permit increases in the data density in the magnetic media, inductive sensing of the magnetization changes along any of those tracks becomes less feasible. The smaller magnetization volumes lead to smaller outputs from an inductive sensor, and there is a limit to the number of turns in the coil used in such a sensor which can be provided to increase the output signal. Even in thin-film versions thereof, such inductive sensing structures remain relatively thick which becomes a problem as the tracks are made more narrow. Thus, sensing of the magnetization changes along the track using thin-film magnetoresistive sensors has become attractive.

Such magnetoresistive sensors for detecting magnetization changes along a track in the magnetic media are typically formed with the magnetoresistive sensor film in a rectangular shape, and sensors based on such films in initial designs therefor had such a sensing film positioned between a pair of highly permeable magnetic material shielding poles with a long side of the film's rectangular shape located adjacent the magnetic media to result in what is oftentimes termed a horizontal sensor. More recently, such magnetoresistive sensors have had an alternative construction with such sensing films positioned between the poles with the short side of the rectangle adjacent the magnetic media to form what is often termed a vertical sensor or an "end-on" sensor. These kinds of sensors were both initially based on use of the anisotropic magnetoresistive effect in the sensing films. This effect gives a maximum change in magnetoresistance due to the sensed magnetic fields on the order of 2.5% at room temperature.

As data tracks in the magnetic media grow ever thinner coupled with use of higher densities of magnetization direction changes therealong, the need for a more efficient converter of such magnetization changes in the magnetic medium into a sufficiently large current or voltage output signal becomes greater. Hence, horizontal and vertical magnetoresistive sensors based on the "giant magnetoresistive effect" and the "spin dependent tunneling effect" were introduced because of the greater changes in resistance possible from corresponding changes in externally applied magnetic fields. A vertical or end-on magnetoresistive sensor based on the "giant magnetoresistive effect" or on the "spin dependent tunneling effect" is typically formed with a nonmagnetic intermediate conductive metal layer in the first instance, or with a nonmagnetic intermediate insulative oxide layer in the second instance, having ferromagnetic layers on opposite sides of the major surfaces thereof with all layers in corresponding rectangular shapes. As before, such a vertical sensor is mounted typically between a pair of ferromagnetic material shielding poles in a narrow gap provided therebetween so that a short side edge of the rectangular film sensor is positioned adjacent the magnetic media approximately in a plane with the sides of the poles also being positioned adjacent the magnetic media with the resultant surface in this plane forming the air bearing surface. Thus, the long sides of the sensor extend inward into the gap between the poles and away from the magnetic media.

Currently, read head transducers are typically provided as hybrid assemblies with the magnetic sensor and the sensor operating circuitry provided on one substrate mounted on the slider arm and the input signal amplifier provided as a separate integrated circuit chip mounted nearby. However, the parasitic capacitance in such an arrangement shunts away more and more of the sensor signal as the data recovery rate is increased leading to higher frequencies being present in the sensor signal. This situation can be improved by building the sensor and its operating circuitry on the input amplifier integrated circuit mounted on the slider arm so that the distance between the sensor output and the amplifier input is smaller thereby lessening the parasitic capacitance associated with that interconnection. One such arrangement is described in an earlier filed co-pending application by J. M. Daughton and Arthur V. Pohm entitled "Magnetic Field Sensor With A Plurality Of Magnetoresistive Thin-film Layers Having An End At A Common Surface" having Ser. No. 08/907,561 which is assigned to the same or successor assignee as the present application and is hereby incorporated herein by reference.

Magnetoresistive "read" sensing structures are made very small to be in accord with the dimensions of the data tracks in the magnetic media from which they are to sense magnetization transitions, and therefore are usually made using monolithic integrated circuit fabrication techniques anyway along with other related thin-film fabrication techniques. Such limited sensing structure sizes and such limited track widths also limit the magnitude of the sensing structure output signal. However, because magnetoresistive sensing structures are to be used with increasingly narrow data tracks in the magnetic media passing by them, an increase in the number of such structures provided side by side may not feasible even though such a plurality of magnetoresistive sensing structures would be most conveniently provided in this manner because of structure sizes. This follows because in that circumstance the steps performed in using monolithic integrated circuit fabrication techniques to provide the plurality of such sensing structures would be just those used to provide one such structure as they are all fabricated simultaneously. Thus, there is desired a sensor configuration which can yield a suitable output signal for a given externally applied input signal without resulting in widening the vertical sensor or sensor portion which would limit the narrowness permitted for tracks in the magnetic media.

BRIEF SUMMARY OF THE INVENTION

The present invention provides plural magnetic field sensing structures in a monolithic integrated circuit chip structure for providing at outputs thereof representations of magnetic field changes provided therein by corresponding sources of such magnetic field changes having poled pair structures with a gap space between them adjacent to which are ones of the plurality of magnetic field sensing structures. These sensing structures are formed of a plurality of magnetoresistive, anisotropic, ferromagnetic thin-film layers at least two of which are separated from one another by a nonmagnetic electrically conductive or insulative layer positioned between them, and at least one of them is interconnected with a circuit formed in the monolithic integrated circuit chip such as an amplifier. The paired pole structures may intersect a surface of the chip perpendicular to the major surfaces thereof or one of, or a surface parallel to, the major surfaces thereof. A magnetic field generating structure may also be included in the chip.

DETAILED DESCRIPTION

Figure 1:
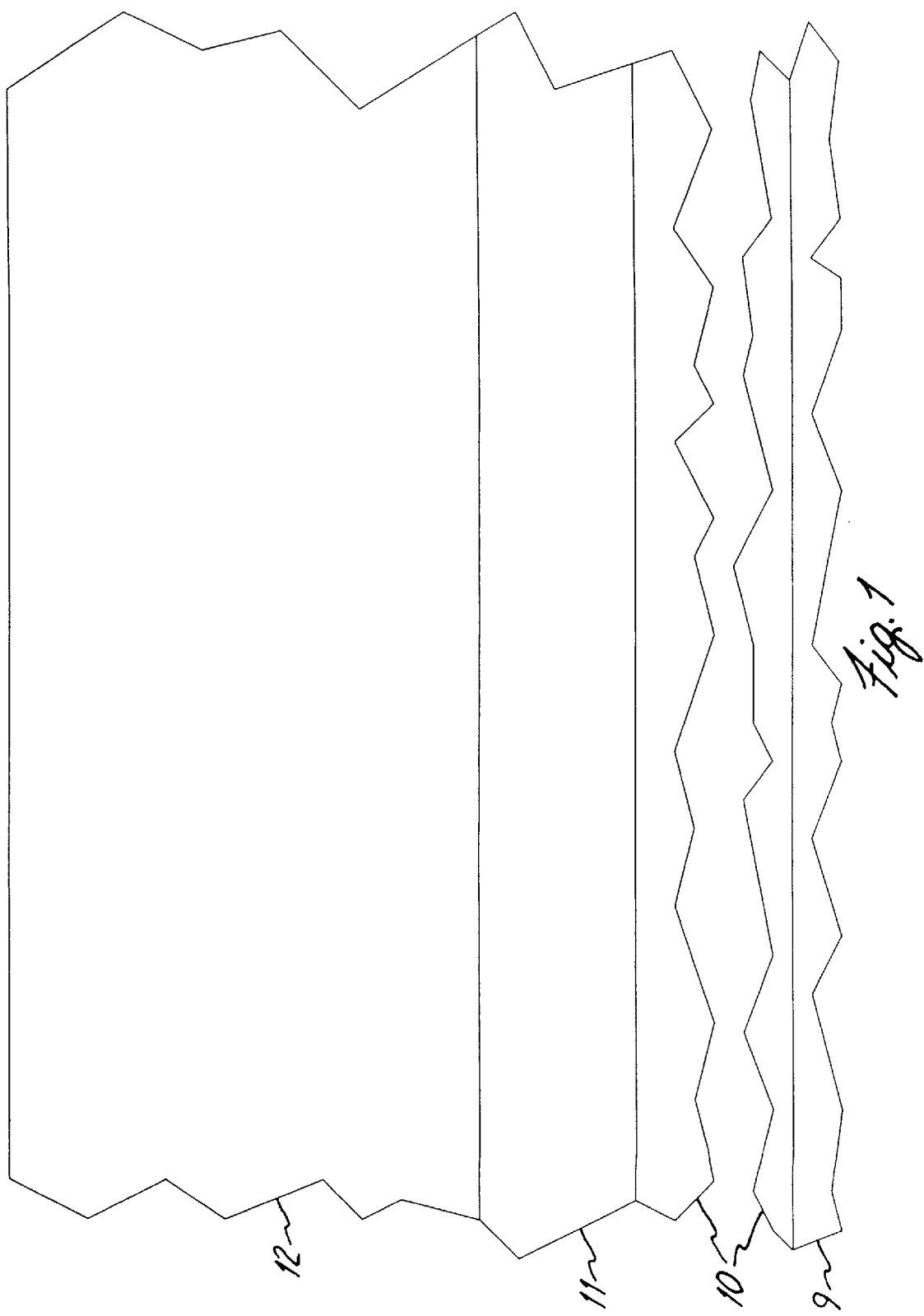
FIGS. 1 through 5 show portions of the results of fabrication steps for forming a device embodying the present invention.

Multiple end-on magnetoresistive sensing structures each adjacent a paired pole structure can be provided in a monolithic integrated circuit chip that intersect in part a common surface of that chip as the "read head" air bearing surface to detect magnetizations of magnetic media portions positioned in parallel tracks each passing a corresponding sensing structure if those sensing structures are formed in suitable configurations using a fabrication process yielding structures on the chip of sufficiently small sizes. Such a sensing structure is shown in an initial form during chip fabrication in FIG. 1 following the earlier fabrication of the semiconductor substrate portion having electronic circuits provided therein such as signal amplifiers for use with such structures. Shown in FIG. 1 is a portion of a ceramic slider arm, 9, formed of aluminum, titanium and carbon, with an already fabricated semiconductor based monolithic integrated circuit chip portion, 10, mounted thereon (for position clarification purposes as the chip maybe completely fabricated first and thereafter mounted on arm 9). An electrical insulating layer, 11, typically of silicon nitride 2500 Å to 5000 Å thick, is deposited on the outer surface of integrated circuit portion 10 to separate and electrically isolate that semiconductor based portion of the chip from the magnetic sensing structures to be provided thereon. Following the providing of such sensing structures, magnetic shielding and flux concentration arrangements as paired pole structures will be provided by magnetic material structures which are typically formed of a mechanically hard but magnetically soft material such as Sendust. An initial layer of Sendust, 12, is provided on insulating layer 11 to a thickness of around 2 $\mu$m.

Figure 2:
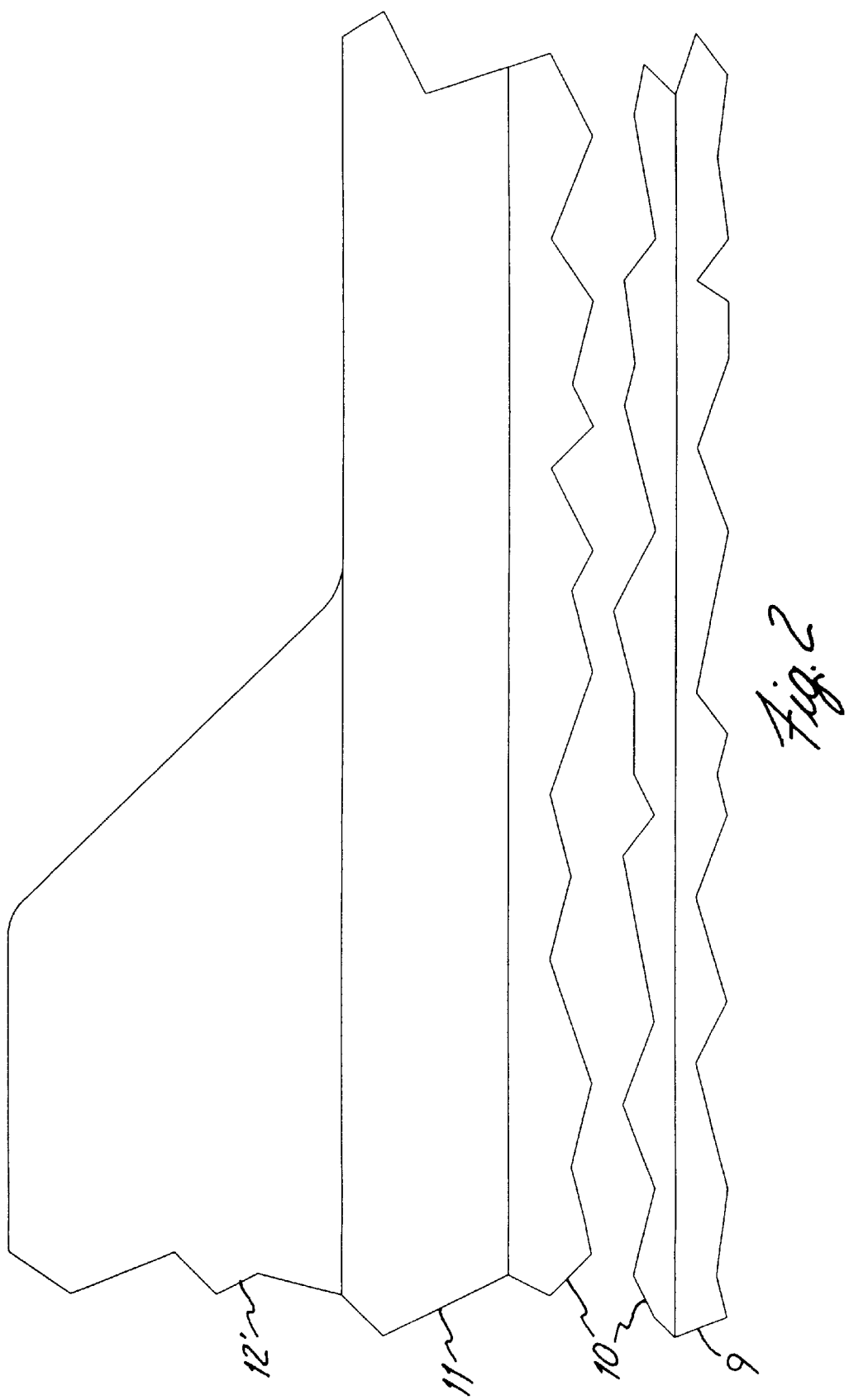

A masking arrangement is then provided on this Sendust layer which, after typical development procedures to provide selected openings therein, has such openings therein where the Sendust below is desired to be removed. Such removal is done by ion milling which, with a suitably chosen mask, will result in the mask being abraded at its edge in such a way during milling as to leave an opening in the Sendust such that the remaining Sendust around the opening has walls with an approximately 45° angle slant as shown in FIG. 2. The remaining portions of Sendust layer 12 of FIG. 1 again has a thickness of about 2 $\mu$m and is shown in FIG. 2 where it has been redesignated 12'.

Figure 3:
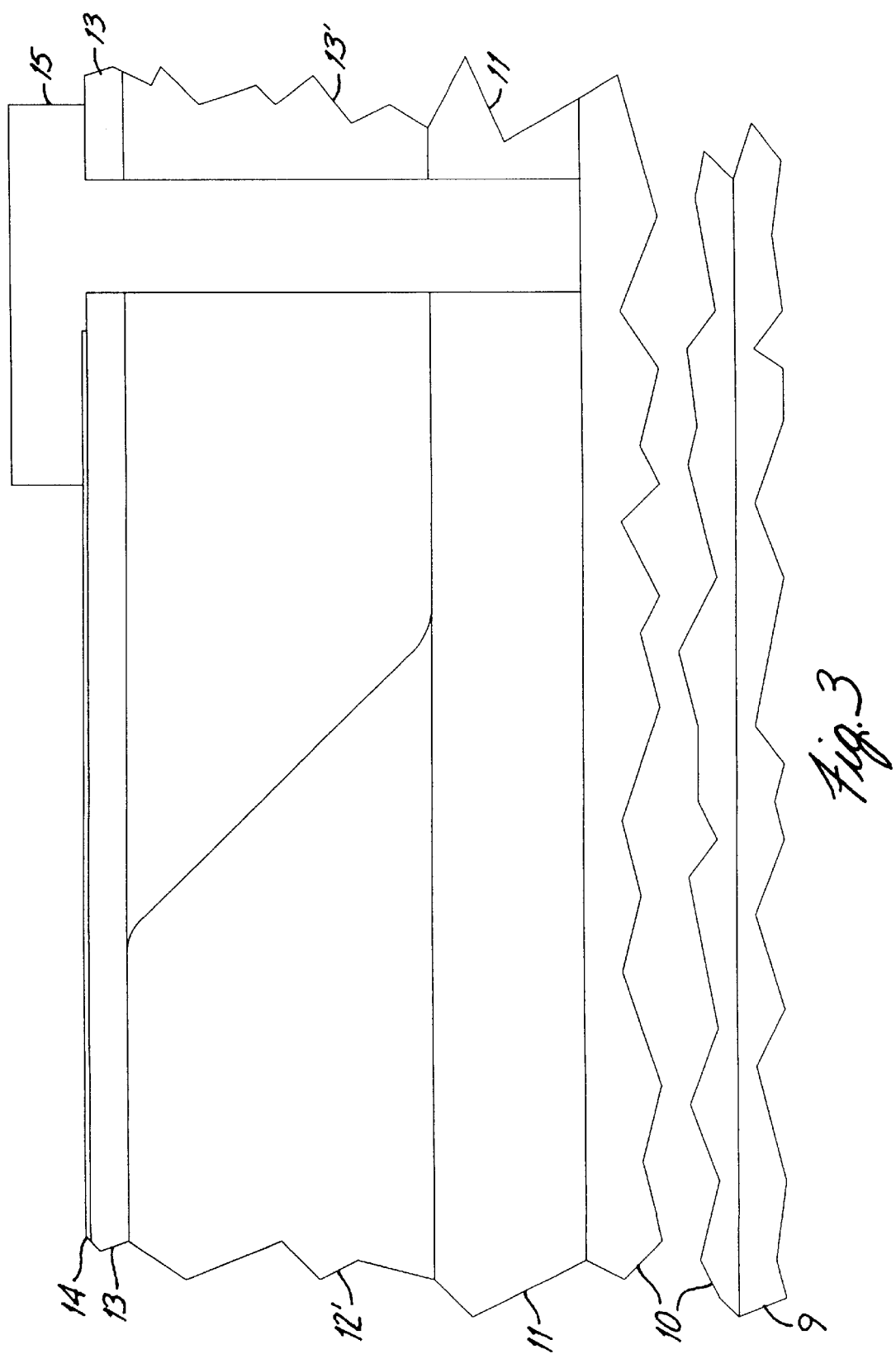

The resulting openings are filled with deposited silicon nitride insulating material to the level of the upper surface of Sendust layer 12' and an insulating material spacing layer, 13, is deposited over the exposed surfaces of Sendust layer 12' and the filler insulating material designated 13' in FIG. 3 (which may be made even and flat by some lapping and chemical mechanical polishing). Spacer layer 13 is typically of silicon nitride to a thickness of 500 to 700 Å thick.

On this insulating layer, a "giant magnetoresistive effect", or GMR, sensing structure is next provided. A typical sensing structure of this kind has a first composite ferromagnetic layer provided on the exposed surface of insulating layer 13 (also as a magnetic flux guide) comprising a deposited first strata of NiFeCo (65%/15%/20% atomic %) of 40 Å thickness covered by depositing a second ferromagnetic strata of FeCo (95%/5% atomic %) thereon with a thickness of 15 Å with both deposited in an orienting magnetic field to result in an easy axis parallel to the plane of the figures, this second strata having a higher magnetic saturation than the first strata to enhance the GMR effect. The magnetically "softer" first strata having a lower magnetic saturation allows the magnetization of the first composite layer to be reoriented to various angles for changing the electrical resistance of the resulting sensing structure by smaller externally applied magnetic fields than would a layer formed of just the magnetically "harder" second strata material. An intermediate layer of copper of 25 Å thickness is then deposited on the second strata of the first composite ferromagnetic layer, and a second composite ferromagnetic layer is thereafter deposited on this intermediate copper layer. The second composite ferromagnetic layer is the same as the first but provided in reverse order with a 15 Å FeCo first strata being initially deposited for enhancing the GMR effect followed by depositing a 40 Å thick second strata of NiFeCo to again yield a composite ferromagnetic layer having a magnetization direction sensitive to externally applied magnetic fields and also serving as a flux guide.

A chrome silicon layer is then deposited to a thickness of 100 Å as a protective layer for the GMR sensor structure, and ion milling is used to remove the unwanted portions of this sensing structure layer to leave the desired GMR sensing structure, 14, which is shown in FIG. 3 but without the structural detail of that layer being indicated there in view of its relative thinness. The chrome/silicon material at the edges of the second composite ferromagnetic layer where sensor electrical interconnections are desired need not be removed because of the thinness of this layer and its relatively good electrical conductivity. Openings are, however, made by masking and etching steps in insulating layers 13 and 11, and in the protective passivation layer over integrated circuit 10 so that the interconnections can extend down to and interconnect with the circuitry in semiconductor integrated circuit chip portion 10 such as an electronic amplifier. A layer of titanium/tungsten is then deposited for a rear interconnection to GMR sensing structure 14 followed by providing a patterned mask through which unwanted portions of the titanium/tungsten interconnection layer are removed to leave the desired sensor rear interconnection, 15, as shown in FIG. 3.

Figure 4:
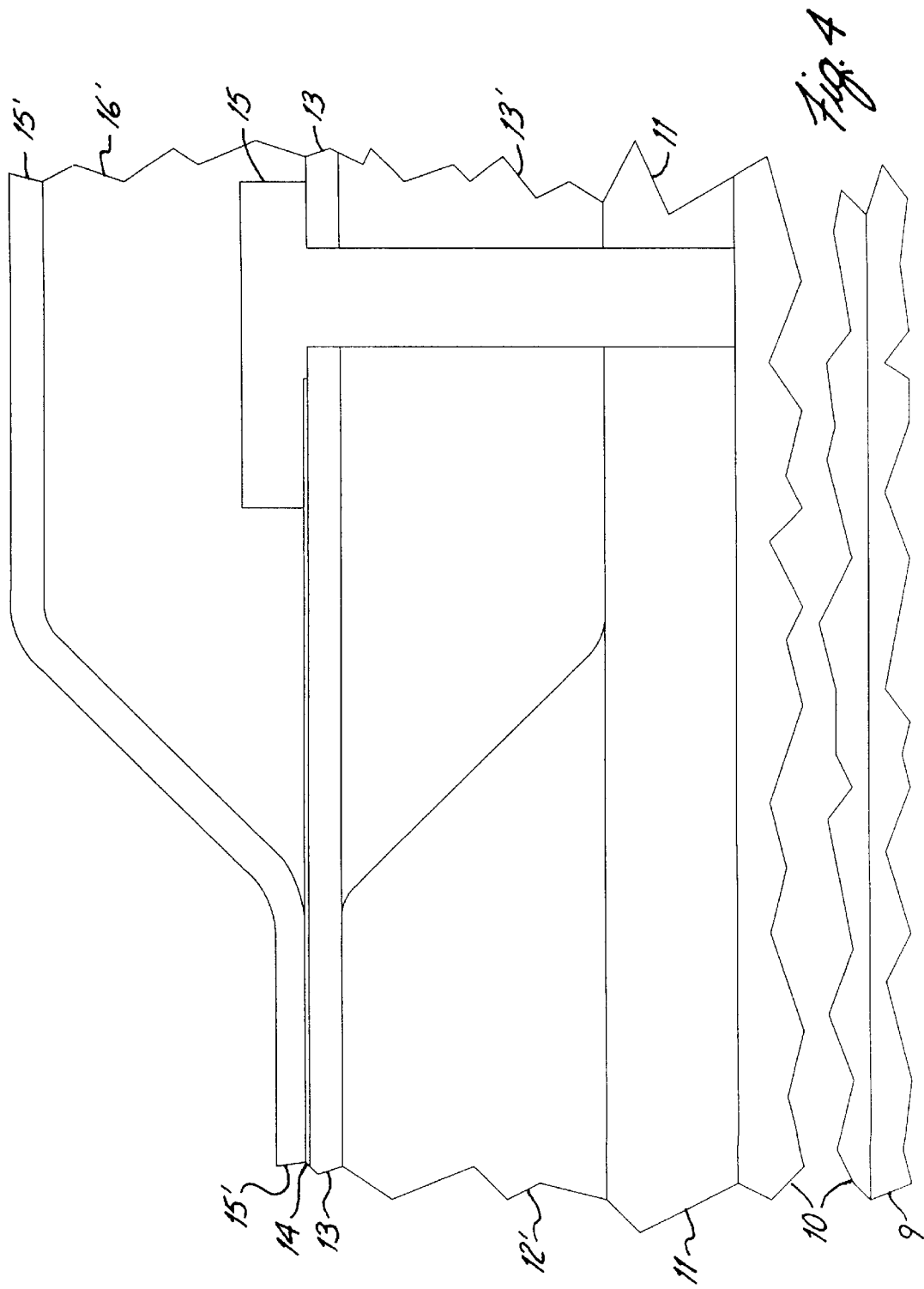

A further 0.5 to 1 $\mu$m thick insulating layer, 16, (not shown) of silicon nitride is provided over GMR sensing structure 14, rear interconnection 15, and the exposed portions of insulating layer 13. An opening is provided in layer 16 across sensor structure 14 from Sendust layer 12' by so as to leave an opening in layer 16 exposing a portion of sensing structure 14 toward the end thereof opposite that in contact with rear interconnection 15. This is accomplished by providing a suitably patterned mask followed by ion milling which again, with a suitably chosen mask, will result in the mask being abraded at its edge in such a way during milling such that the remaining portions of layer 16 around the opening has walls with an approximately 45° angle slant as shown in FIG. 4. The remaining portions of insulating layer 16 of FIG. 4 still has a thickness of 0.5 to 1 $\mu$m and is shown in FIG. 4 designated by 16'.

Thereafter, a further metal interconnection layer of titanium/tungsten is deposited (not shown in FIG. 4) covering insulating layer remainder 16' and the exposed portion of sensing structure 14 to a thickness of 400 to m700 Å for the purpose of providing a front electrical interconnection to that structure. Masking and etching are used to form this further metal layer into a front interconnection, 15', to sensing structure 14 with the result shown in FIG. 4. Finally, another Sendust layer, not shown in FIG. 4, is deposited over metal interconnection layer 15' to a thickness of around 2 $\mu$m.

Figure 5:
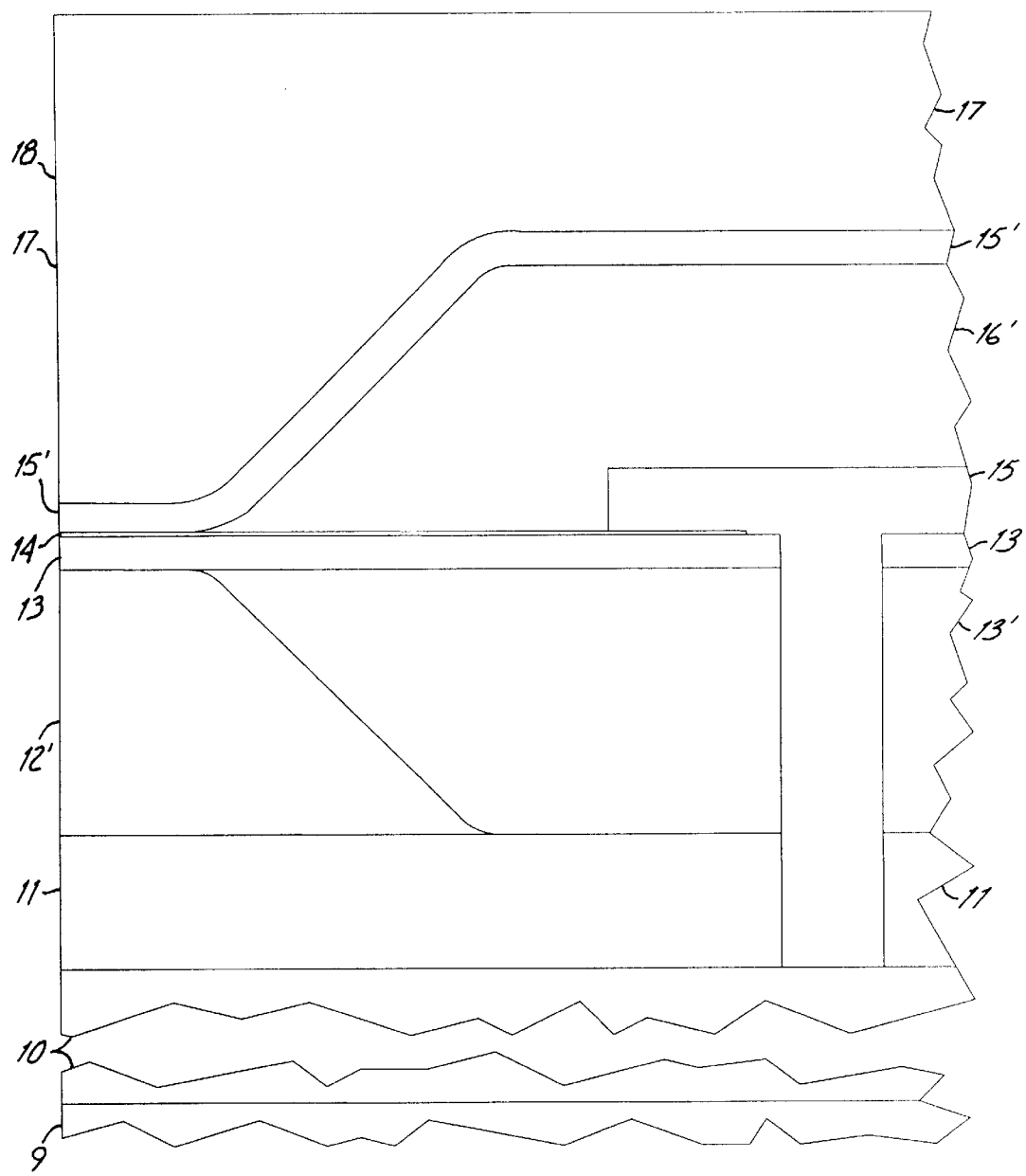

The structure of FIG. 4 with the final Sendust layer not shown is then lapped on the left side to mechanically remove material inwardly to a degree sufficient to leave the desired front contact structure length followed by chemical mechanical polishing with the results shown in FIG. 5 in which the final Sendust layer is shown after lapping and polishing with the designation 17. The resulting exposed left side surface of the device, 18, will be the air bearing surface of the "read head" in operation (which can be covered by a very thin layer of diamond-like carbon for wear protection). Sendust structures 12' and 17 form a pair of magnetic material pole structures or poles to provide magnetic shielding and flux concentration about the gap around sensing structure 14 provided by insulating layer 13 and front interconnection 15' and they are further separated from sensing structure 14 inwardly from air bearing surface 18 than at that surface to reduce magnetic field shunting from that sensing structure.

These paired poles 12' and 17 and sensing structure 14 thus in part intersect a potion of air bearing surface 18 that is more or less perpendicular to the major surfaces of semiconductor chip portion 10 and insulating layer 11 supporting these poles and this sensing structure. Additional and similar paired poles and sensing structures are simultaneously fabricated on chip portion 10 and insulating layer 11 intersecting air bearing surface 18 positioned parallel to paired poles 12' and 17 and sensing structure 14 inwardly from the plane of FIG. 5 sufficiently close to one another to each be over a separate track in the magnetic media passing thereby during use.

Electrical current-to-magnetic signal storage transducers (i.e. "write" heads) and magnetic signal flux-to-electric signal retrieval transducers (i.e. "read" heads) are often desired so as to be able to write and read, respectively, several parallel tracks, say eight to sixteen, simultaneously, but as currently provided are very complex hybrid assemblies. Nevertheless, there are increasing demands on these heads both with respect to the rate of data passing therethrough which is required to be ever higher, and to the widths of the data tracks in the magnetic storage medium which are always being sought to be made narrower and narrower to thereby increase stored data density. Even though the "read heads" described above aid in the achievement of higher data rates by lowering parasitic capacitance along the recovered data transmission path, this improvement may not be enough at a sufficiently high data rate.

These design problems can be overcome by providing such heads in monolithic integrated circuit chips rather than hybrid assemblies as before, and by having the paired poles, and possibly the sensing structures, intersect a chip surface as the air bearing surface that is parallel to major semiconductor surfaces supporting them to further shorten the recovered data transmission paths. The read heads are again configured to have the plural heads provided in these chips arrayed thereacross so as to be more or less perpendicular to the direction taken by the plural data tracks in the moving magnetic medium passing thereby during operation so as to accommodate these heads interacting with the passing tracks. Forming read heads right in the integrated circuit chip intersecting the major surfaces thereof allows further shortening of the data paths from those heads to the input amplifiers formed in the semiconductor chip portion with relatively small path parasitic capacitance. Providing the heads in such a chip arrangement allows the techniques used for fabricating semiconductor monolithic integrated circuit chips, which are well developed, to also be used in fabricating such chips with heads, both "read" and "write" types.

The resulting heads fabricated in such chips must each include magnetic shielding thereabout, i.e. poles, to prevent interaction with adjacent memory locations in the passing magnetic medium. However, the flux involved at each selected memory location adjacent a head must be drawn to extend inwardly into a corresponding gap in such shielding in which this head is located to permit the required interaction of that head with the magnetic medium through the fields generated by track portions thereof. The magnetic fields generated from stored datum at a location in the magnetic medium, which otherwise have a strong field component parallel to the planar major surface of the integrated circuit chip, must instead be converted to have a strong field component normal to the planar major surface of the integrated circuit chip near each head in the shield structure thereabout which is then to be sensed by a head structure that is more or less parallel to these normal fields. Similarly, gaps must be provided in the magnetic shielding adjacent writing inductive coils so the magnetic fields generated thereby can extend outwardly into the magnetic medium moving thereby.

With such heads being formed in monolithic integrated circuit chips so as to allow conventional integrated circuits to be formed in the semiconductor material that also serves as a substrate for these head structures, local amplification circuits can be provided as indicated above and connected directly to the read heads to help to improve the signal-to-noise ratio of the signals generated by the magnetic medium tracks moving by those read heads. The resulting head and amplifier arrangement would typically require ten interconnections with subsequent circuitry but this can be reduced by sampling the signal from each and multiplexing the data obtained through an output circuit, i.e. the data from a retrieved digital word can be collected in parallel and transmitted serially. In addition, data processing circuitry can also be provided in the monolithic integrated circuit chip semiconductor portion to permit checking for errors and to provide some error correction to reduce or eliminate those errors.

Figure 6:
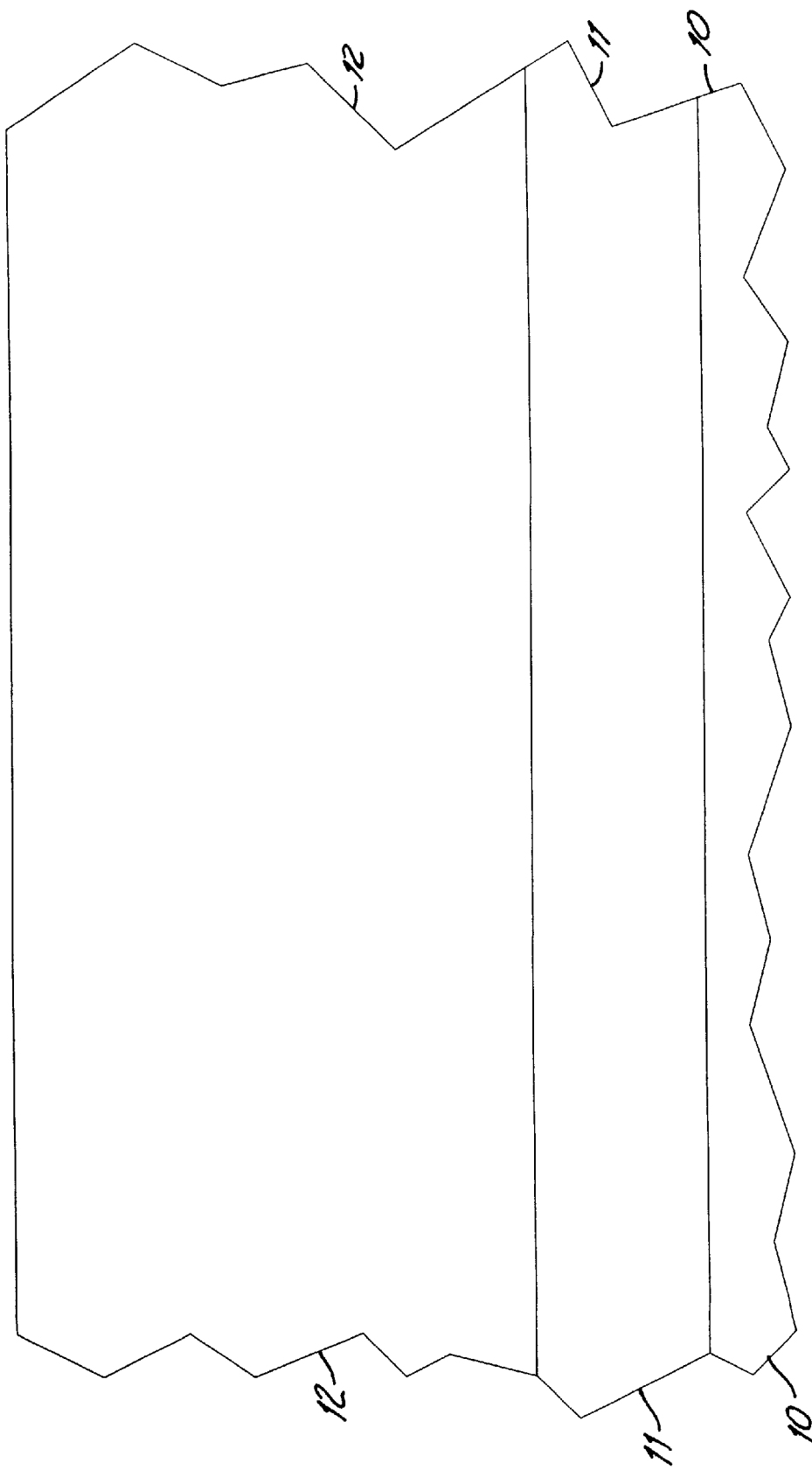
FIGS. 6 through 9 show portions of the results of fabrication steps for forming a device embodying the present invention.

A read head of this sort having interconnections on each side thereof, i.e. an interconnection on either side of the read head sensing layer, and so more or less on either side of a data track passing therebelow in the moving magnetic medium, can be formed starting on an insulator provided over an otherwise typical monolithic semiconductor integrated circuit chip portion 10 as shown in FIG. 6. This insulator separates the head structures from the already fabricated semiconductor integrated circuit chip portion 10. Various circuits for controlling the "read heads" while obtaining and transmitting the data obtained thereby from a moving magnetic medium passing these heads are contained in integrated circuit semiconductor chip portion 10 which are to be in some instances connected through the insulator to those heads. For purposes of providing such read head structures, the insulator indicated is provided by insulating layer 11, again typically of silicon nitride with a thickness of 2500 Å to 5000 Å, that is deposited on the outer surface of integrated circuit semiconductor chip portion 10 resulting from fabrication processing to this point. Layer 11 serves as a further part of the substrate including chip 10 supporting such "read heads". Shielding and flux concentration will again be provided by magnetic material structures which are typically formed of a mechanically hard but magnetically soft material such as Sendust. Initial Sendust layer 12 is again provided on insulating layer 11, and to a thickness of 1 to 3 µm.

Figure 7:
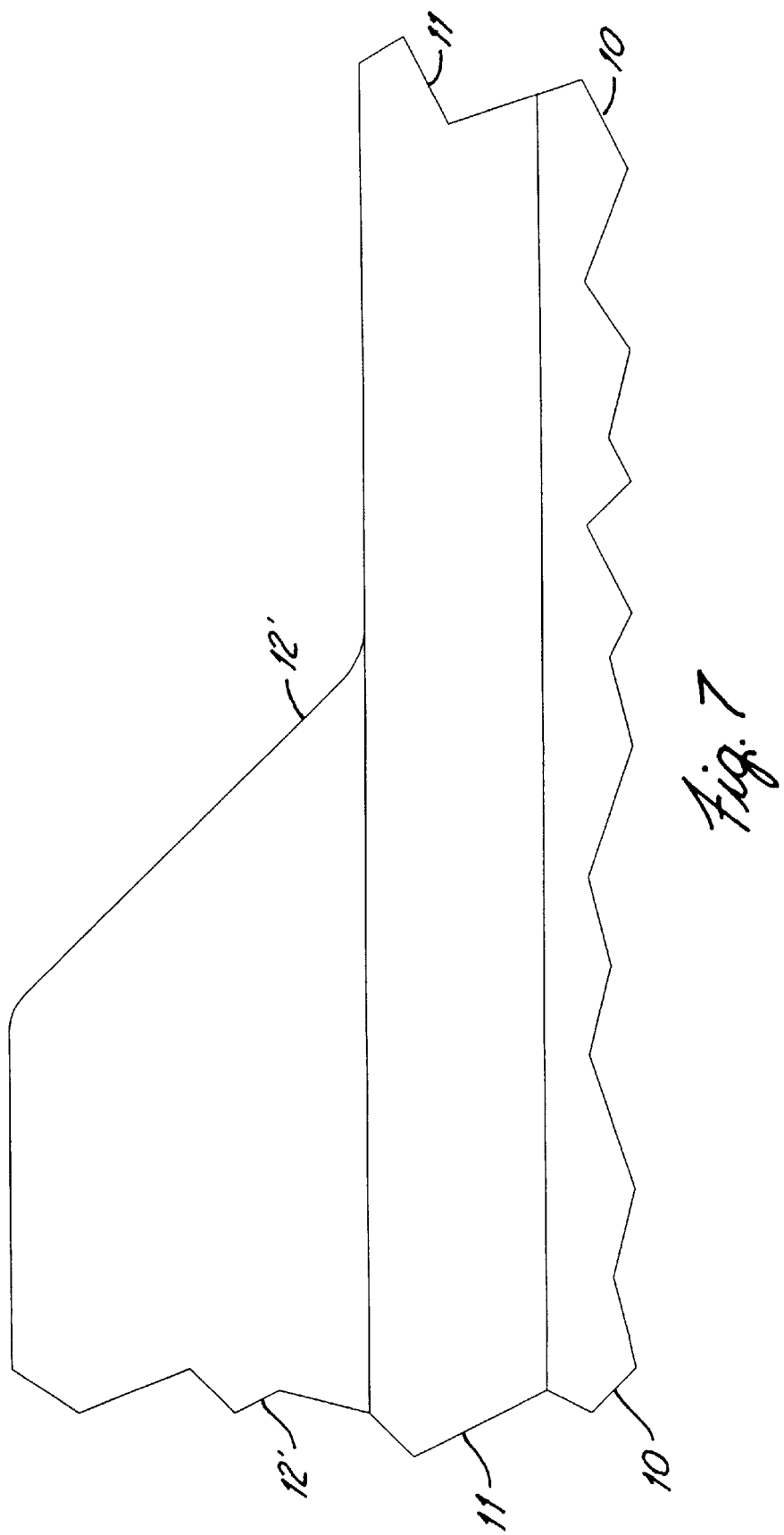

This Sendust layer then has a masking arrangement provided thereon which, after typical development procedures to provide selected openings therein, has such openings therein located where the Sendust below is desired to be removed down to insulating layer 11. Such removal is done by ion milling which, with a suitably chosen mask, will result in the mask being abraded at its edge in such a way during milling as to leave an opening in the Sendust so that the remaining Sendust around the opening has walls with an approximately 45° angle slant as shown in FIG. 7. The remaining portions of Sendust layer 12 of FIG. 6 has a thickness of 1 to 2 µm and is shown in FIG. 7 where it has been redesignated 12'.

Thereafter, insulating layer 13, again of silicon nitride, is deposited to a typical thickness of 500 Å on the surface of remaining portions of Sendust layer 12' and on the portions of insulating layer 11 exposed in the Sendust layer openings. On insulating layer 13, "giant magnetoresistive effect", or GMR, sensing structure 14 is next provided. Sensing structure 14 is provided here just as it was provided in the read device described above as shown in FIG. 3. Openings are then again made in insulating layers 13 and 11, and in the protective passivation layer over integrated circuit semiconductor chip portion 10 so that the interconnections can here too extend down to and interconnect with the circuitry in integrated circuit semiconductor chip portion 10.

Figure 8:
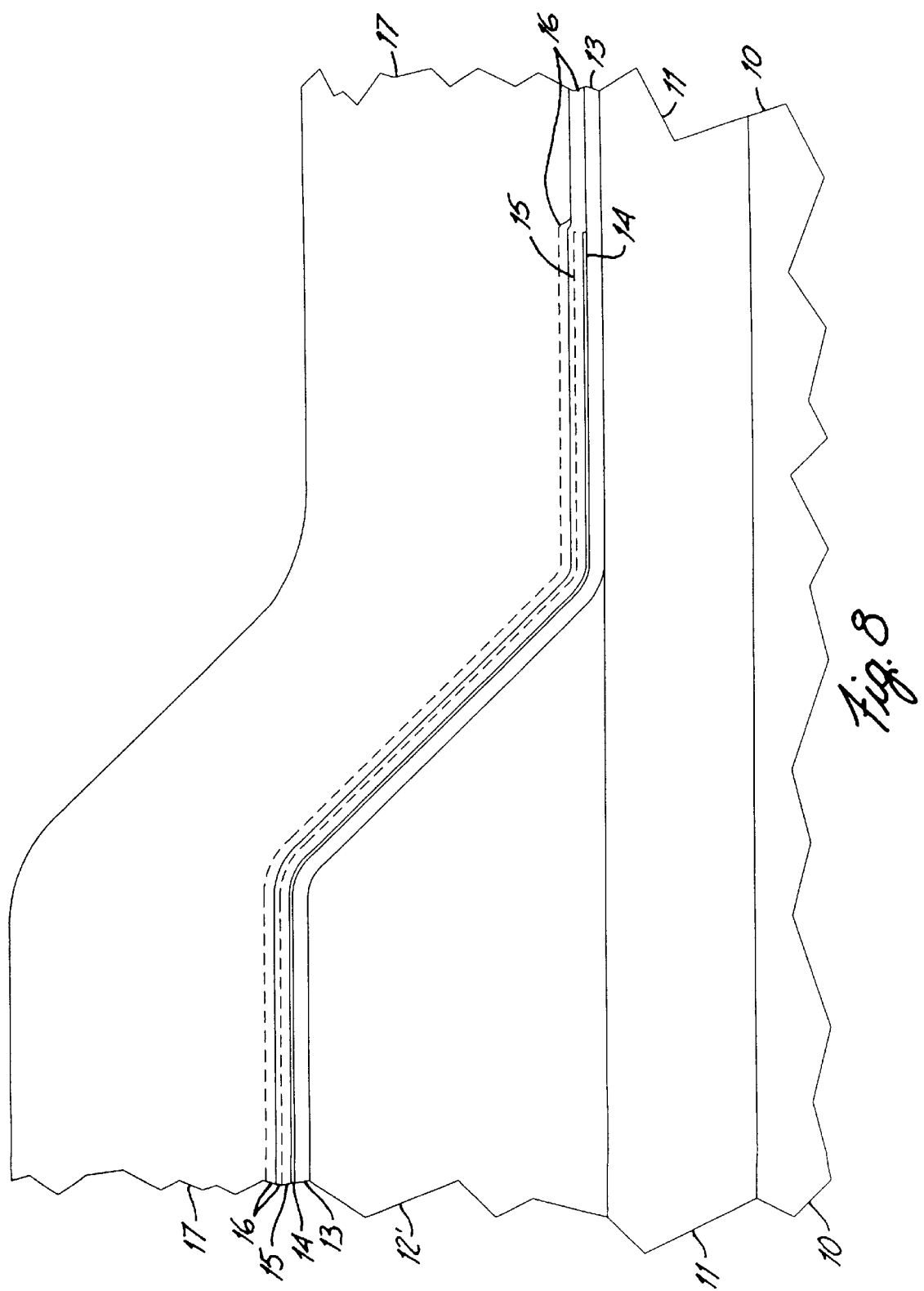

A layer of titanium/tungsten is then deposited for interconnections to GMR sensing structure 14 followed by providing a patterned mask through which unwanted portions of the titanium/tungsten interconnection layer are removed to leave the desired interconnections 15 as shown in FIG. 8. This figure shows a section view taken along the middle of GMR sensing structure 14 between the edge interconnections thereto so that interconnection 15, on one end of sensing structure 14, appears in dashed line form because of being inwardly from the plane of FIG. 8. Finally, a further 500 Å thick insulating layer 16 of silicon nitride is provided over GMR sensing structure 14, interconnections 15, and the exposed portions of insulating layer 13. The portion of layer 15 over the portion of sensing structure 14 near the plane of FIG. 8 is shown in solid line form, and the portion of that layer over interconnection 15 is shown in dashed line form in being inward from the plane of FIG. 8.

Upon completion of GMR sensing structure 14, interconnections 15, and protective insulating layers 13 and 16 thereabout, final magnetic shielding and concentration layer 17 of Sendust is deposited to a thickness of 1 to 2 µm. The final result following this step is also shown in FIG. 8. The structure shown in FIG. 8 then has upper portions thereof mechanically lapped away to provide a resulting partially vertical read head based on GMR sensing structure 14. This lapping is followed by chemical mechanical polishing of the surface remaining after the lapping.

Figure 9:
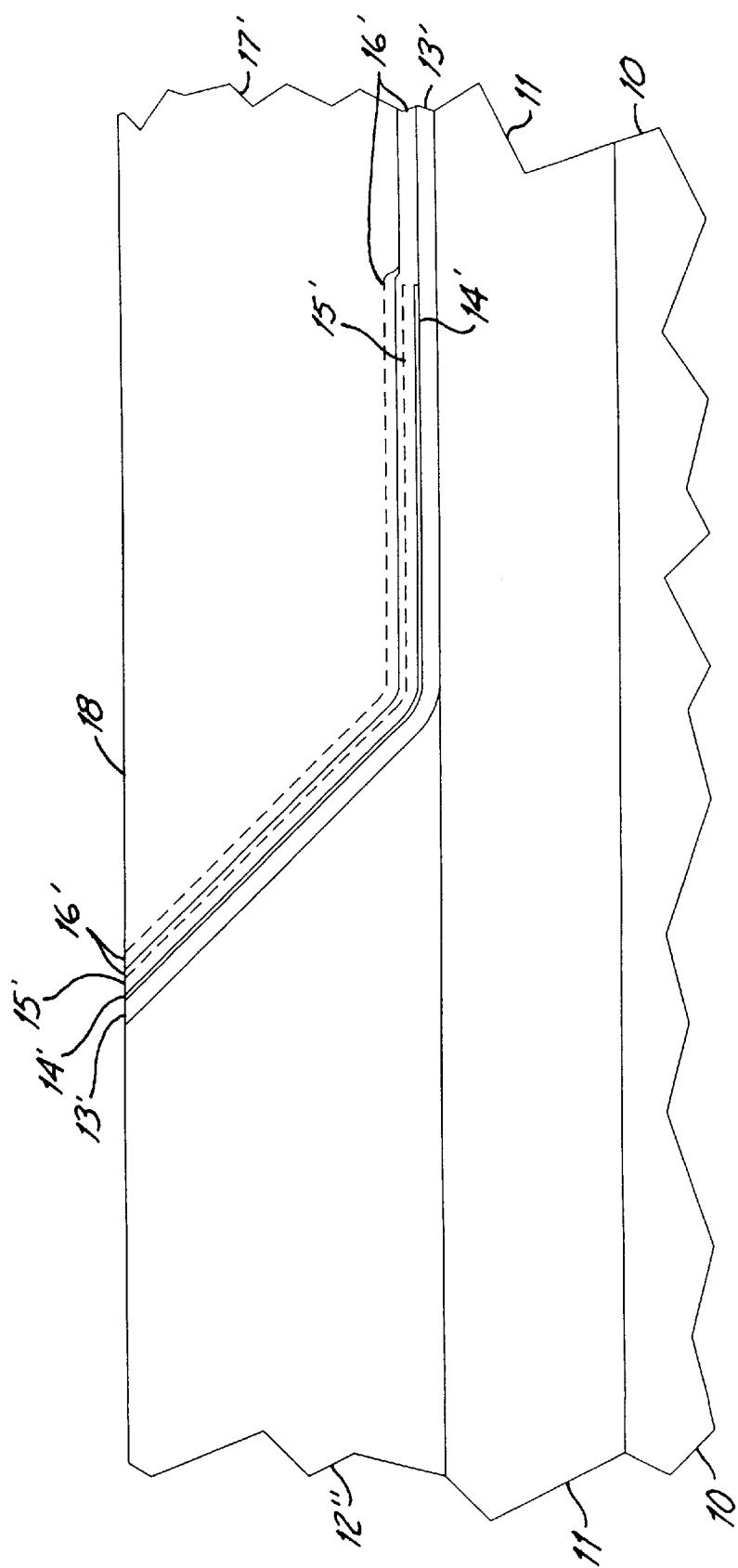

The result of the structure in FIG. 8 following the mechanical lapping and polishing thereof is shown in FIG. 9 with exposed surface 18 remaining after these steps forming the air bearing surface for the read head which will be positioned adjacent the magnetic medium (moving rapidly from left to right in FIG. 9) in normal operation. Typically, a protective surface layer of very thin diamond-like carbon will also be deposited on surface 18 (not shown here) to form the final air bearing surface as a protection against mechanical wearing during situations when the read head comes into contact with the magnetic medium.

Sendust layer remnant 12' of FIG. 3 is redesignated as 12" in FIG. 9 after its alteration due to the lapping, and similarly insulating layers 13 and 16 have been redesignated 13' and 16' in FIG. 9 with interconnections 15 being redesignated 15' and with GMR sensing structure 14 in FIG. 8 being redesignated 14' in FIG. 9. Also, Sendust layer 17 of FIG. 8 has been redesignated 17' in FIG. 9, these redesignations following the structural alterings resulting from forming surface 18 common to all of the sensing structures and paired pole structures fabricated simultaneously with sensing structure 14' and pole structures 12" and 17', a surface which is parallel to the major surfaces of semiconductor chip portion 10 and insulating layer 11 supporting these poles and sensing structures. Insulating layers 13' and 16' along with interconnections 15' provide a gap between magnetic structures 12" and 17' around read head sensing structure 14' to concentrate there the flux generated in the magnetic medium moving by air bearing surface 18 (separated by the diamond-like carbon layer mentioned above) during typical operation. This flux will extend in magnetic structures 12" and 17' along the gap to be parallel to much of "read head" sensing structure 14' as a partially vertical sensor before crossing therethrough to provide a high sensitivity head.

Figure 10:
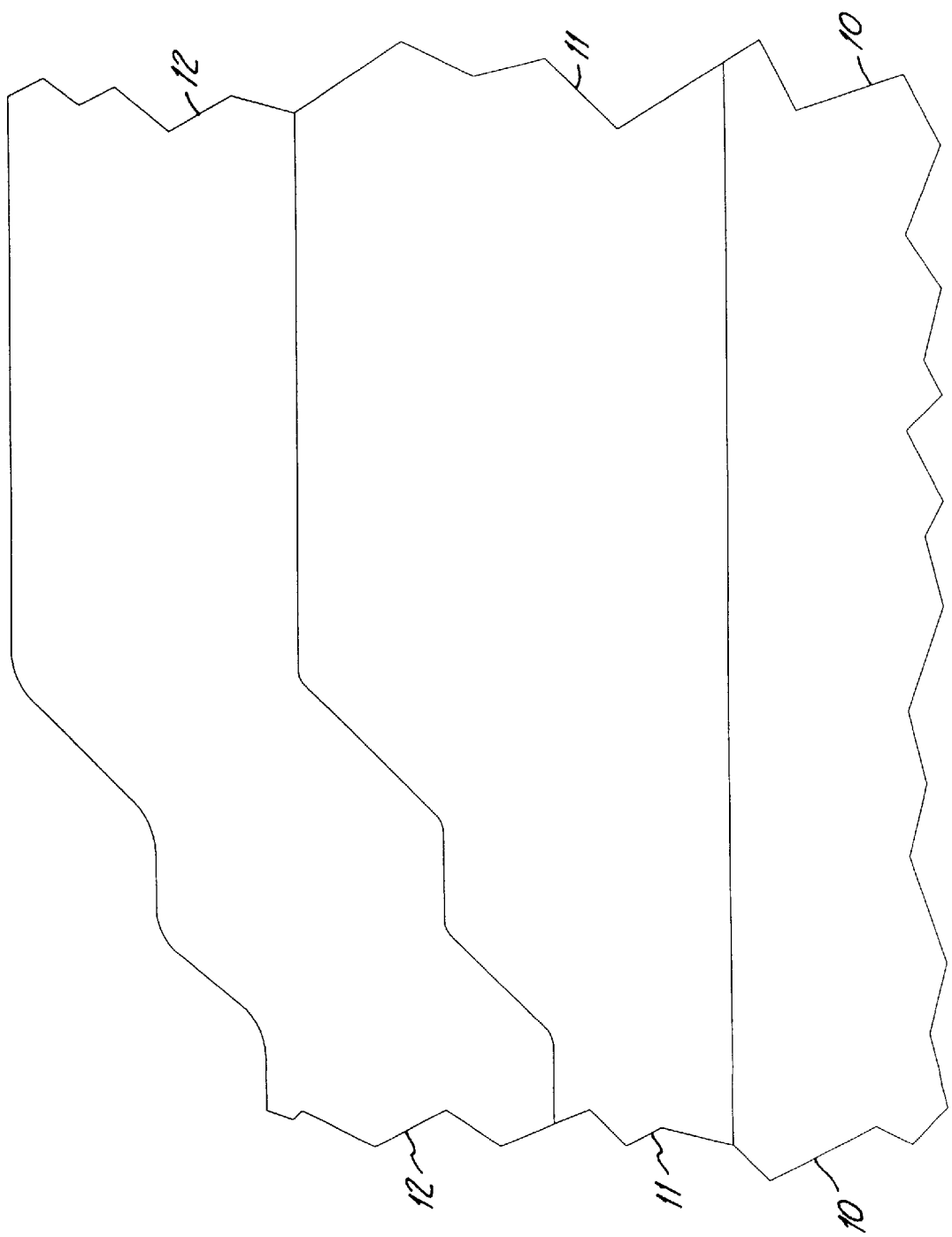
FIGS. 10 through 14 show portions of the results of fabrication steps for forming a device embodying the present invention.

An alternative "read head" structure arrangement is often desired in integrated circuit chips 10 in which the circuit interconnections are made at the front and the rear of the partially vertical read head structure (as made to the front and rear of the fully horizontal sensing structure of FIG. 5 viewed with respect to the upper surface of integrated circuit semiconductor chip portion 10 supporting the head) rather than at either side thereof as they are in the "read head" structure shown in FIG. 9. Such an alternative structure can be formed again in semiconductor based monolithic integrated circuit chip portion 10 as it is in the fabrication process to this point by again having insulating layer 11 thereon, though this time with some initial shaping of that insulating layer as is shown in FIG. 10. This shaping can be accomplished by providing successive masks followed by ion milling leaving a 45° first sloping edge coming up from the bottom of that opening to a horizontal intermediate tier level which in turn is followed by a further 45° sloping edge to the top of layer 11. The thickness of layer 11 at that point might be on the order of 1.5 μm with the thickness of the layer at the point of the intermediate tier being between 7000 and 12,000 Å. The thickness at the bottom of the opening in layer 11 where that layer is thinnest might be on the order of 2000 to 5000 Å. The shaping allows reducing the pole thicknesses near the gap at the air bearing surface to reduce magnetic field shunting.

Thereafter, again Sendust layer 12, 1 to 2 μm thick, is deposited over shaped layer 11 to provide the final structure result shown in FIG. 10. The structure in FIG. 10 is then lapped to mechanically remove material at the upper surface thereof, followed by chemical mechanical polishing, so as to leave approximately 1000 Å of Sendust in layer 12 above the intermediate tier of layer 11 with the results shown in FIG. 11. The altering of insulating layer 11 and Sendust layer 12 by such mechanical lapping and polishing motivates redesignating them as layers 11' and 12', respectively, in FIG. 11.

Figure 11:
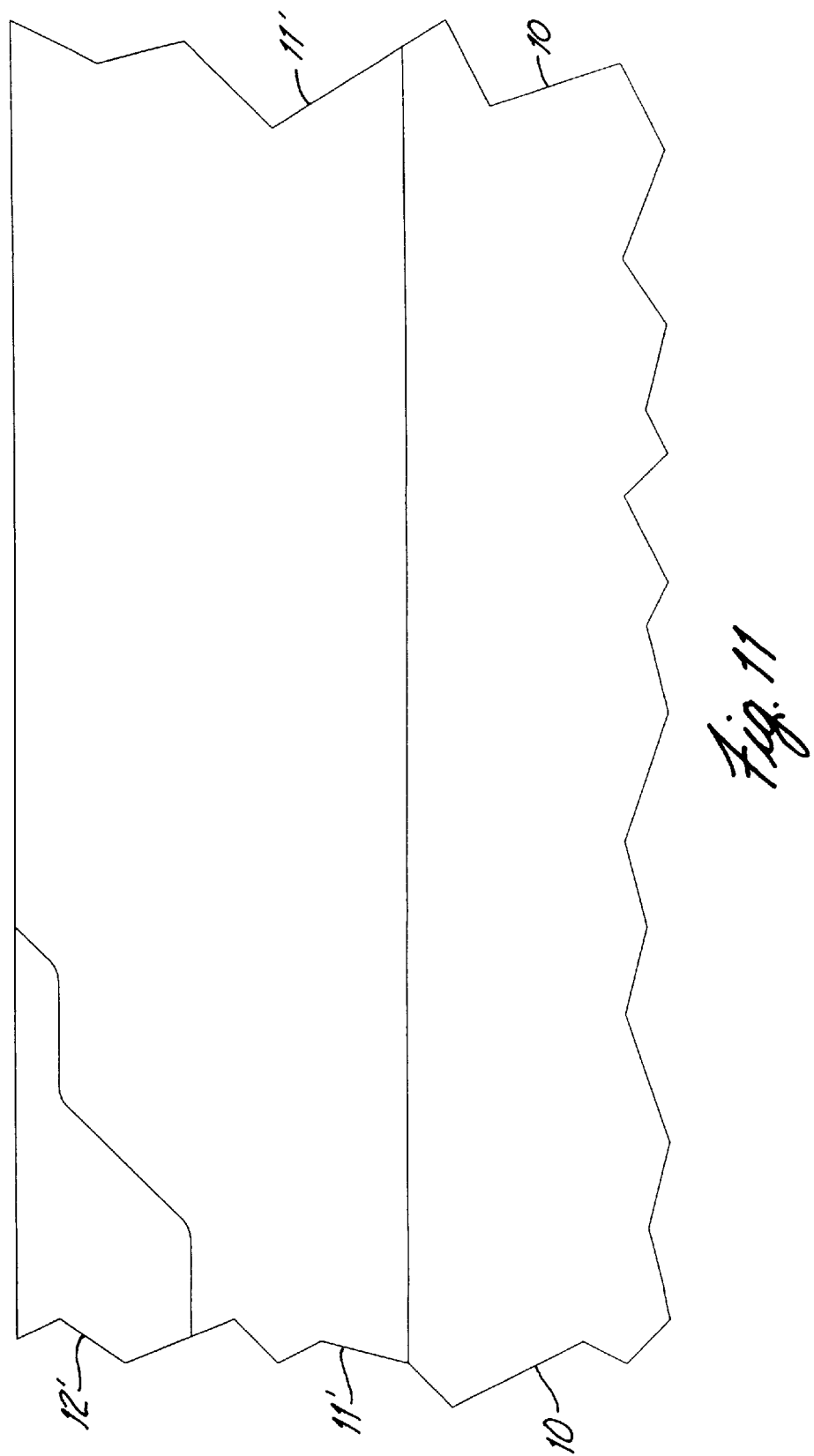
Figure 12:
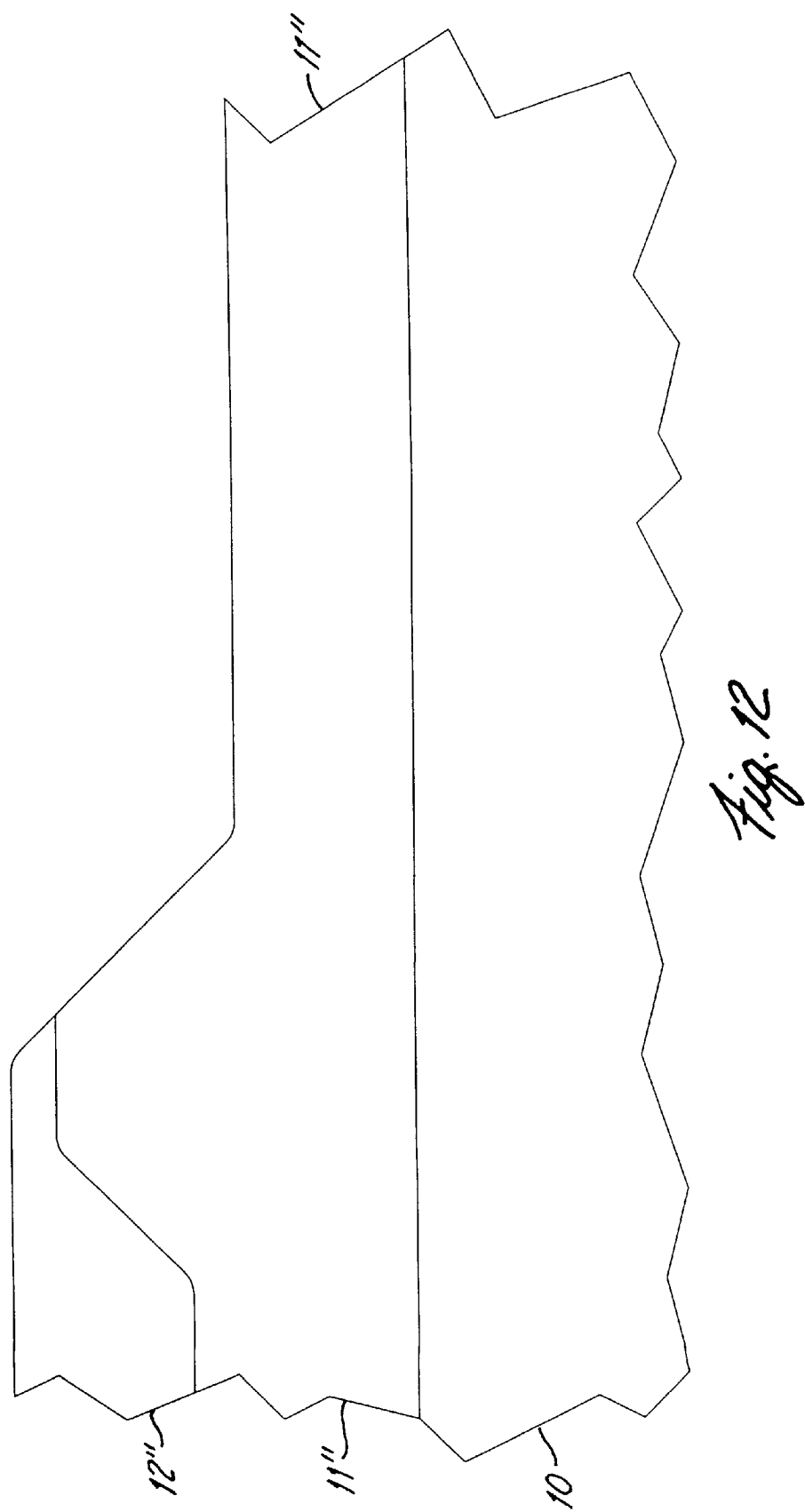

The surface resulting from the mechanical lapping and polishing is then again masked and ion milling is used to remove a portion of Sendust layer 12' and insulating layer 11' to provide an opening again with a 45° wall slant. This result is shown in FIG. 12 where insulating layer 11' of FIG. 11 is redesignated 11" in FIG. 12 after the opening provided therein by ion milling, and Sendust layer 12' of FIG. 11 has been redesignated layer 12" in FIG. 12.

Figure 13:
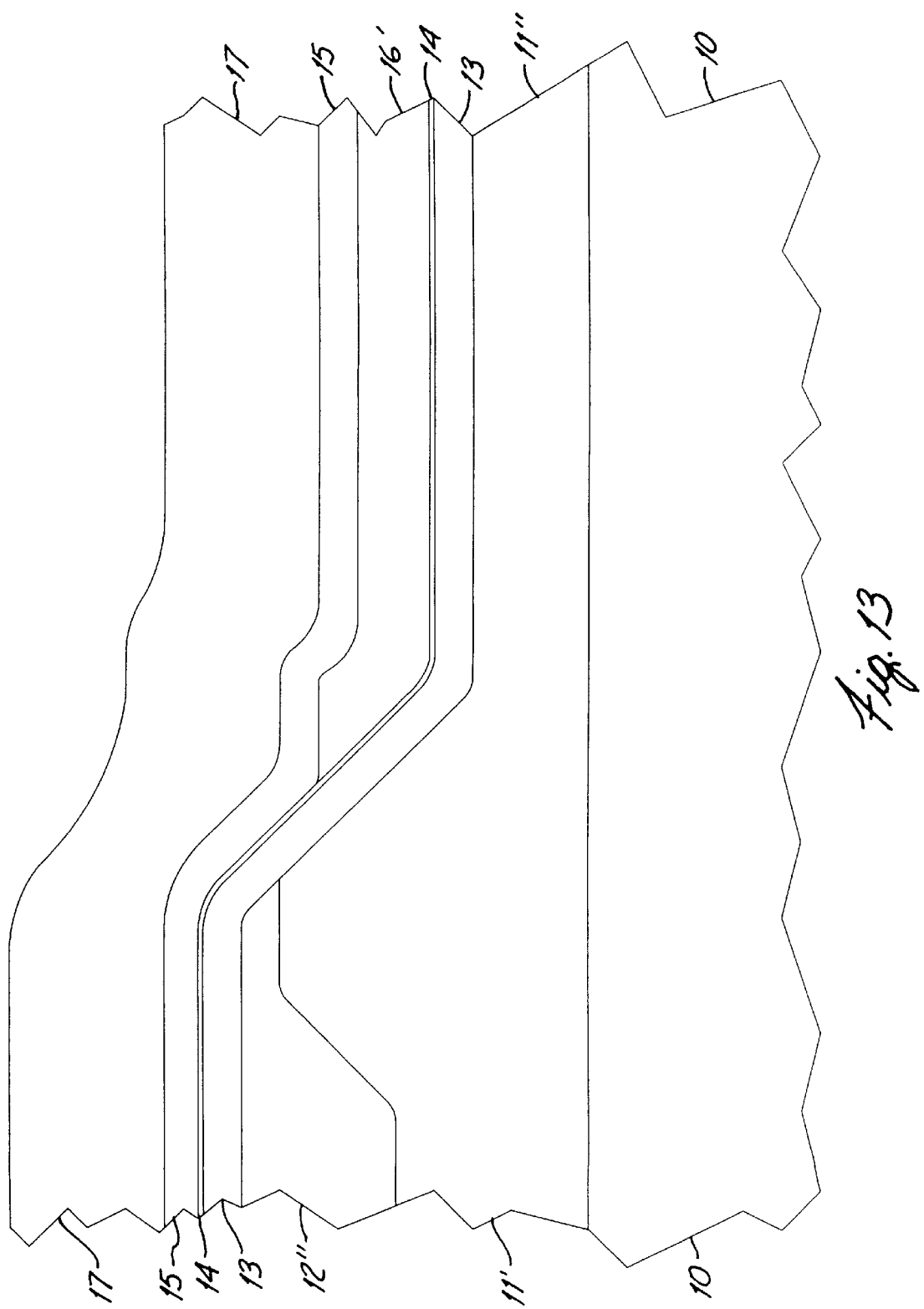

Next, insulating layer 13, typically of silicon nitride, is here again deposited to a thickness of 400 to 1000 Å on the exposed surface of Sendust layer 12" and the surface formed by the opening in layer 11". On the resulting surface of insulating layer 13 a GMR sensing layer is again provided and sensing structure 14 is formed just as sensing structure 14 was provided in FIGS. 3 and 8 including the composite ferromagnetic layers therein serving as magnetic flux guides. In a change from the fabrications of the previously described structures associated with these last two figures, the present structure as fabricated to this point is then covered with insulating layer 16 (not shown) of silicon nitride to a thickness of 2000 to 3000 Å before any interconnection structures are formed as shown in FIG. 13 for the purpose of reducing the length of the sensing structure over which the front interconnection contact extends to reduce electrical shunting of that sensing structure. Masking and etching are then used to remove a portion of insulating layer 16, which is thus redesignated 16' in FIG. 13, to thereby expose the portion of sensing structure 14 above the midpoint of its covering on the 45° wall shown in that figure, and to provide other openings therein and in insulating layers 13 and 11, and in the protective passivation layer over integrated circuit semiconductor chip portion 10 so that the interconnections can here again extend down to and interconnect with the circuitry in integrated circuit semiconductor chip portion 10. Thereafter, a metal interconnection layer of titanium/tungsten is deposited covering insulating layer remainder 16' and the exposed portion of sensing structure 14 for the purpose of providing a front electrical interconnection to that structure and other interconnections. This interconnection layer is deposited to a thickness of 400 to 1000 Å, and masking and etching are then used to form the desired interconnection 15. Finally, Sendust layer 17 is deposited over metal interconnection 15 and the exposed portions of insulating layers 13 and 16' to a thickness of around 2 μm.

Figure 14:
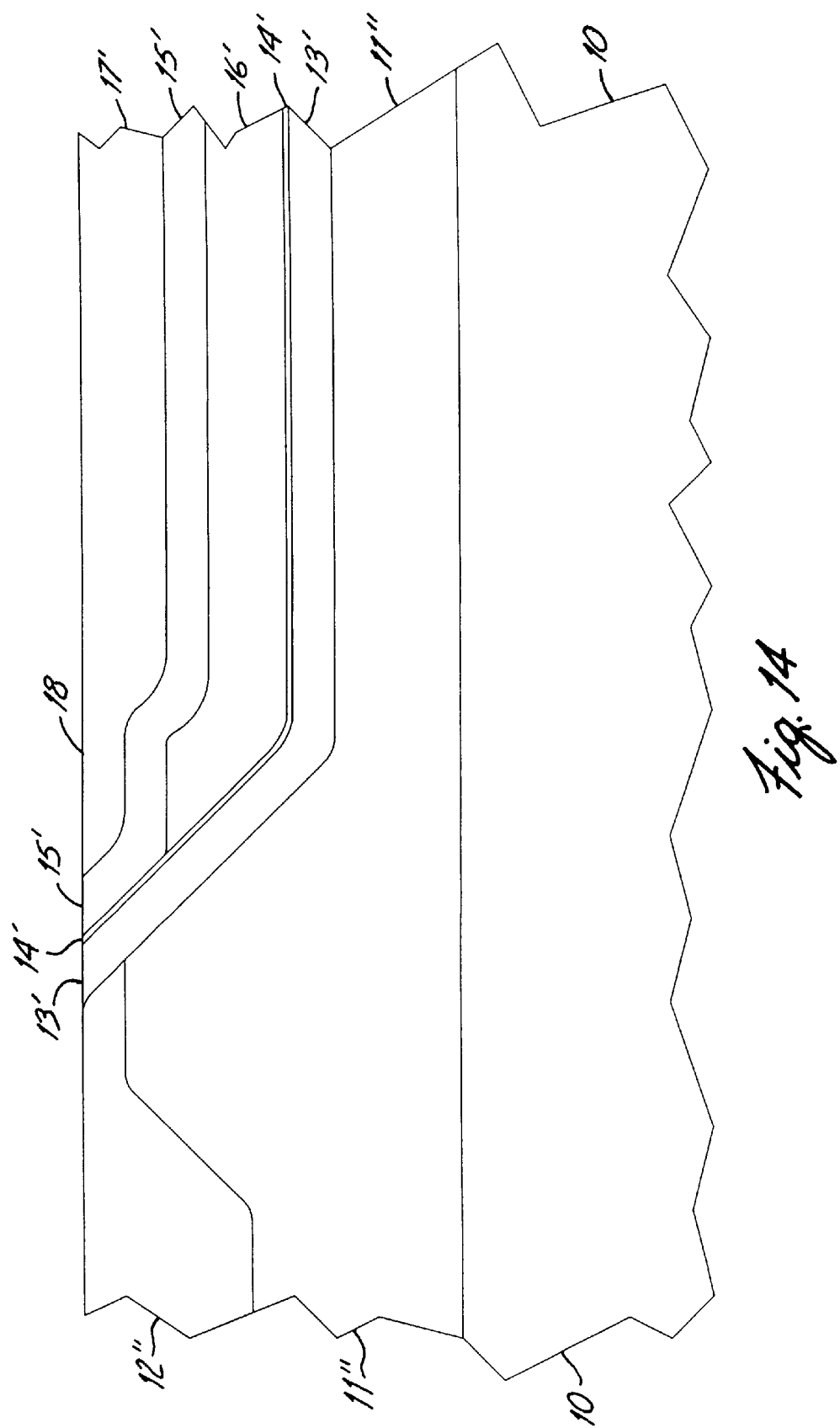

The structure of FIG. 13 is then lapped to mechanically remove material down to the surface of Sendust layer 12" followed by chemical mechanical polishing with the results shown in FIG. 14. The resulting exposed surface of the device 18 will be the air bearing surface in operation (which can again be covered by a very thin layer of diamond-like carbon for wear protection) which is common to all of the sensing structures and paired pole structures fabricated simultaneously with sensing structure 14' and pole structures 12" and 17', a surface which is parallel to the major surfaces of semiconductor chip portion 10 and insulating layer 11 supporting these poles and sensing structures. As a result of the lapping mechanical removal of material, insulating layer 13 of FIG. 13 is redesignated 13' in FIG. 14 as before, sensing structure 14 of FIG. 13 is redesignated 14' in FIG. 14 as before, metal and front interconnection layer 15 of FIG. 13 is redesignated 15' in FIG. 14 as before, and Sendust layer 17 of FIG. 13 is redesignated 17' in FIG. 14 as before. As can be seen, metal layer 15' becomes a front contact to sensing structure 14' with the rear contact to that layer not being shown here though formed more or less concurrently therewith.

A further alternative "read head" structure arrangement with the circuit interconnections made at the front and the rear of the partially vertical read head structure can be provided using a "spin dependent tunneling effect" sensing structure rather than a GMR sensing structure. Such an alternative structure can be formed again in semiconductor based monolithic integrated circuit chip portion 10 as it is in the fabrication process to this point by again having insulating layer 11 thereon, with again some initial shaping of that insulating layer as is shown in FIGS. 10 through 12.

Figure 15:
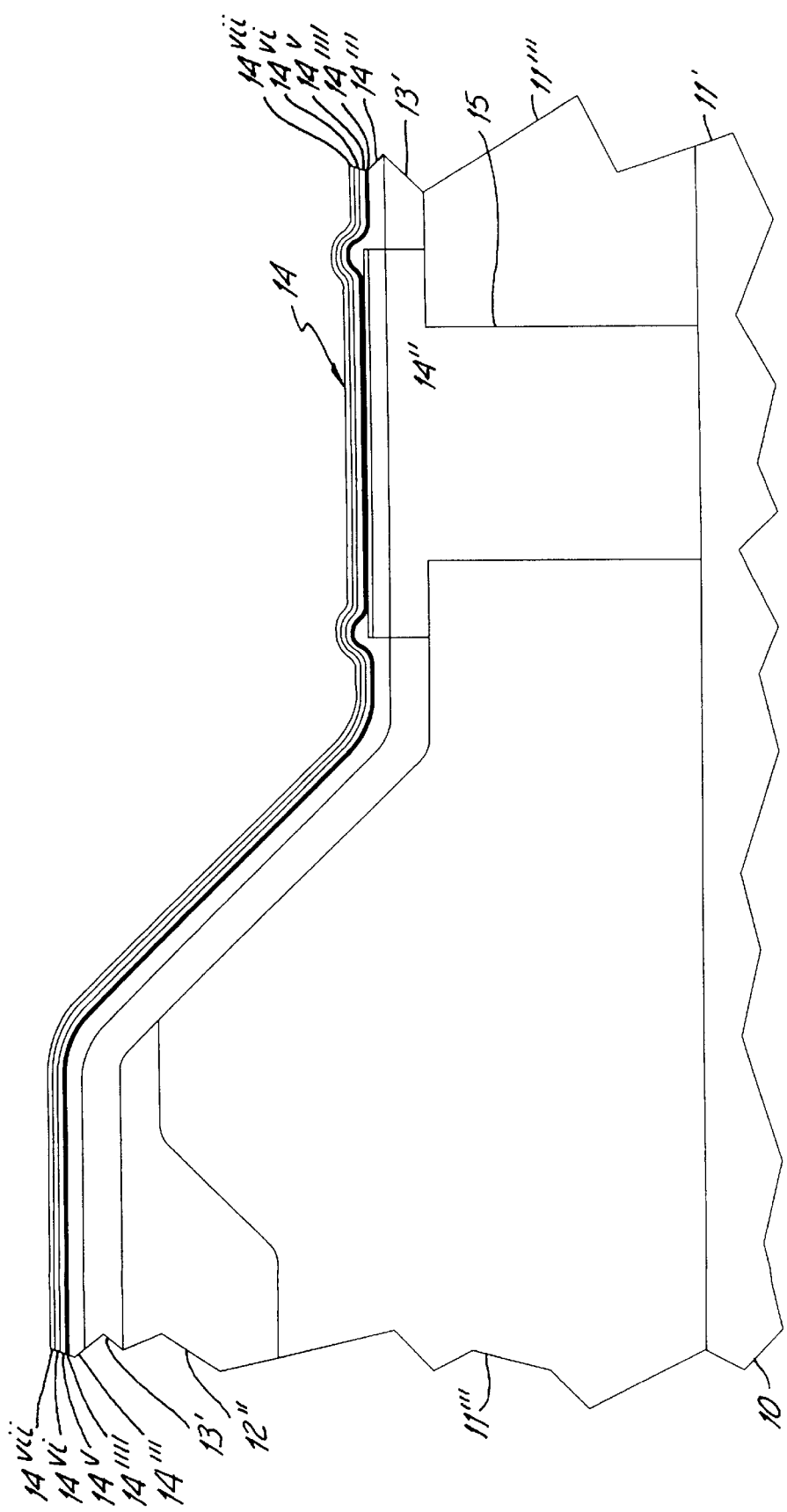
FIGS. 15 through 17 show portions of the results of fabrication steps for forming a device embodying the present invention.

Thus, starting from the structure shown in FIG. 12, insulating layer 13, typically of silicon nitride, is here again deposited to a thickness of 400 to 1000 Å on the exposed surface of Sendust layer 12" and the surface formed by the opening in layer 11". Masking and etching are then used to remove a portion of insulating layer 13, which is thus redesignated 13' in FIG. 15, to provide openings therein and in insulating layer 11, which is thus redesignated 11''', and in the protective passivation layer over integrated circuit semiconductor chip portion 10 so that certain interconnections can here again extend down to and interconnect with the circuitry in integrated circuit semiconductor chip portion 10. Thereafter, a metal interconnection layer of titanium/tungsten is deposited covering insulating layer remainder 13' for the purpose of providing a bottom electrical interconnection to the sensing structure and perhaps other interconnections. This interconnection layer is deposited to a thickness of 400 to 1000 Å, and masking and etching are then used to form the desired interconnection 15.

On the resulting surface of insulating layer 13' and on interconnection 15 a "spin dependent tunneling effect" sensing structure 14 is provided. A typical sensing structure of this kind has a first "pinned" ferromagnetic layer provided on a "pinning" antiferromagnetic layer that is provided on the exposed surface of interconnection 15. This "pinning" layer is formed of CrPt Mn (45%/45%/10% atomic %) deposited to a thickness of 200 to 300 Å and the "pinned" ferromagnetic layer is formed of NiFeCo (65%/15%/20% atomic %) deposited to a 30 Å thickness with both deposited in an orienting magnetic field to result in an easy axis parallel to the plane of the figures so that the magnetization of the ferromagnetic layer will be essentially maintained in this direction even in the presence of externally applied magnetic fields. Ion milling is used to form this "pinning-pinned" layer combination into a joint layer having the extent desired for the sensing structure. Thereafter, 200 to 400 Å of silicon nitride is deposited with masking and etching then used to provide an opening therein down to the "pinned" ferromagnetic layer. Aluminum is then deposited to cover this ferromagnetic to thickness of 20 Å which is then oxidized to form an intermediate layer of aluminum oxide $Al_2O_3$ as the tunneling barrier with a thickness of 15 Å.

Second and third ferromagnetic layers for flux guides separated by a gap forming layer are thereafter deposited to have magnetization directions which will react to externally applied fields to change the electrical resistance through the resulting sensing structure. The second ferromagnetic layer is deposited formed of NiFeCo (65%/15%/20% atomic %) to a 50 Å thickness, the gap forming layer is typically formed of ruthenium, Ru, deposited to a thickness of 30 Å as it contributes to layer smoothness although it could be formed of other conductive materials such as copper (Cu) or tantalum (Ta), and the third ferromagnetic layer is deposited formed of NiFeCo (65%/15%/20% atomic %) again to a 50 Å thickness with both ferromagnetic layers being antiferromagnetically coupled to one another and deposited in an orienting magnetic field to result in an easy axis perpendicular to the plane of the figures. Ion milling is used to form the barrier layer, the second and third ferromagnetic layers and the gap forming layer to be coextensively over the "pinning-pinned" joint layer combination and insulating layer 13' above Sendust layer 12" as further shown in FIG. 15. Sensing structure 14 is thus completed by the "pinning-pinned" joint layer combination, 14", beneath the opened silicon nitride layer, 14''', provided across the aluminum oxide barrier, 14"", from the second ferromagnetic layer, 14$^v$, to thus be adjacent to the magnetic flux guide structure formed by second ferromagnetic layer 14$^v$ as one flux guide, gap forming layer, 14$^{vi}$, and the third ferromagnetic layer, 14$^{vii}$, as the other flux guide as these flux guides are separated by the gap forming layer.

Figure 16:
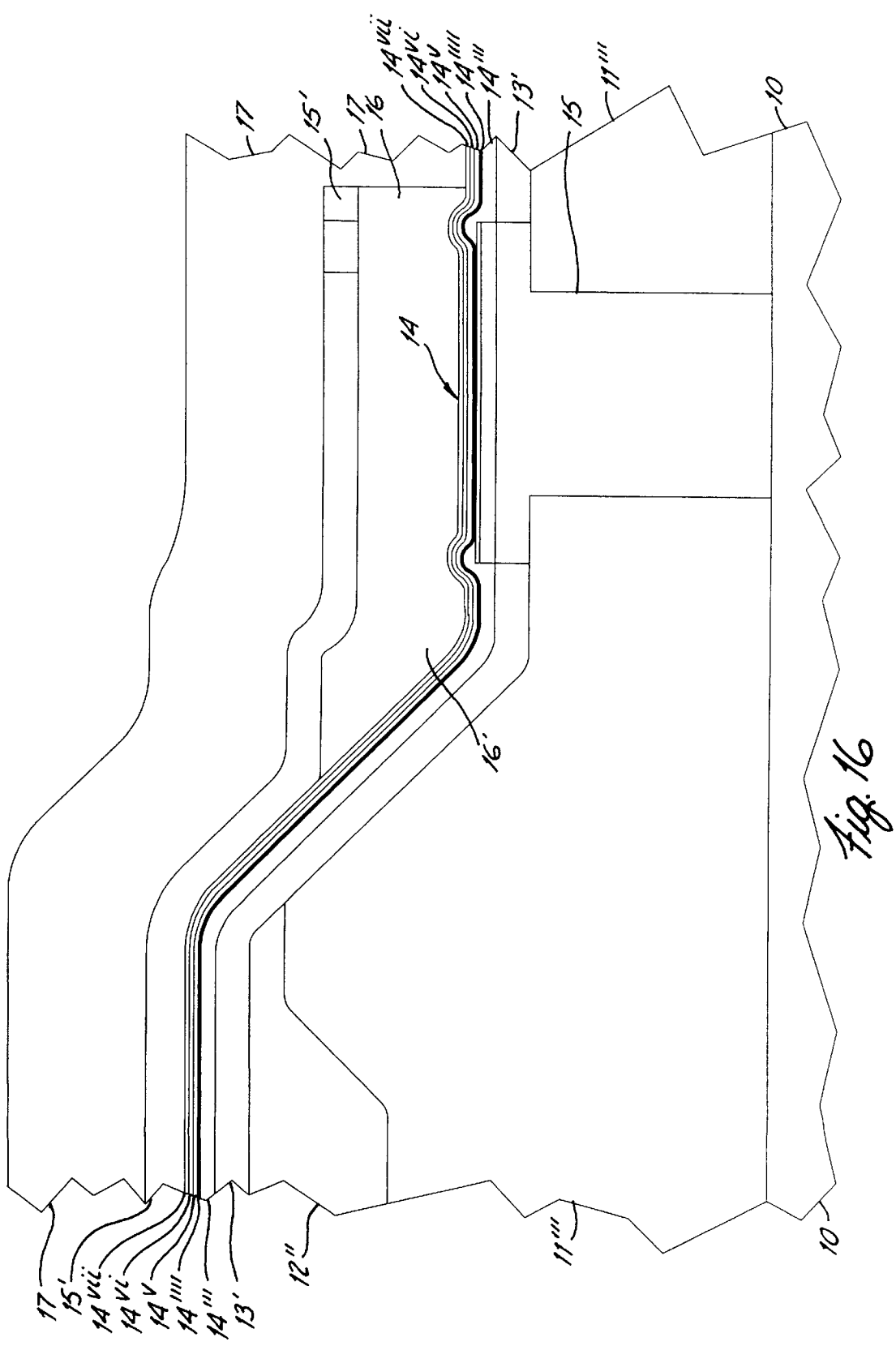

The present structure as fabricated to this point is then covered with insulating layer 16 (not shown) of silicon nitride to a thickness of 2000 to 3000 Å before any interconnection structures are formed as shown in FIG. 16 for the purpose of reducing the length of the sensing structure over which the front interconnection contact extends to reduce electrical shunting of that sensing structure. Masking and etching are then used to remove a portion of insulating layer 16, which is thus redesignated 16' in FIG. 16, to thereby expose the portion of third ferromagnetic layer 14$^{vii}$ above the midpoint of its covering on the 45° wall shown in that figure, and to provide other openings therein and in insulating layers 14''', 13 and 11, and in the protective passivation layer over integrated circuit semiconductor chip portion 10 so that the interconnections can here again extend down to and interconnect with the circuitry in integrated circuit semiconductor chip portion 10. Thereafter, a metal interconnection layer of titanium/tungsten is deposited covering insulating layer remainder 16' and the exposed portion of third ferromagnetic layer 14$^{vii}$ for the purpose of providing a front electrical interconnection to that layer and other interconnections. This interconnection layer is deposited to a thickness of 400 to 1000 Å, and masking and etching are then used to form the desired interconnection 15'. Masking and etching are then used to remove a portion of insulating layer 16' to thereby expose the portion of third ferromagnetic layer 14$^{vii}$ to the right of sensing structure 14. Finally, Sendust layer 17 is deposited over metal interconnection 15' and the exposed portions of insulating layers 13' and 16' to a thickness of around 2 μm and in the opening in layer 16' to close a portion of the magnetic flux path to include sensing structure 14 as shown in FIG. 16.

Figure 17:
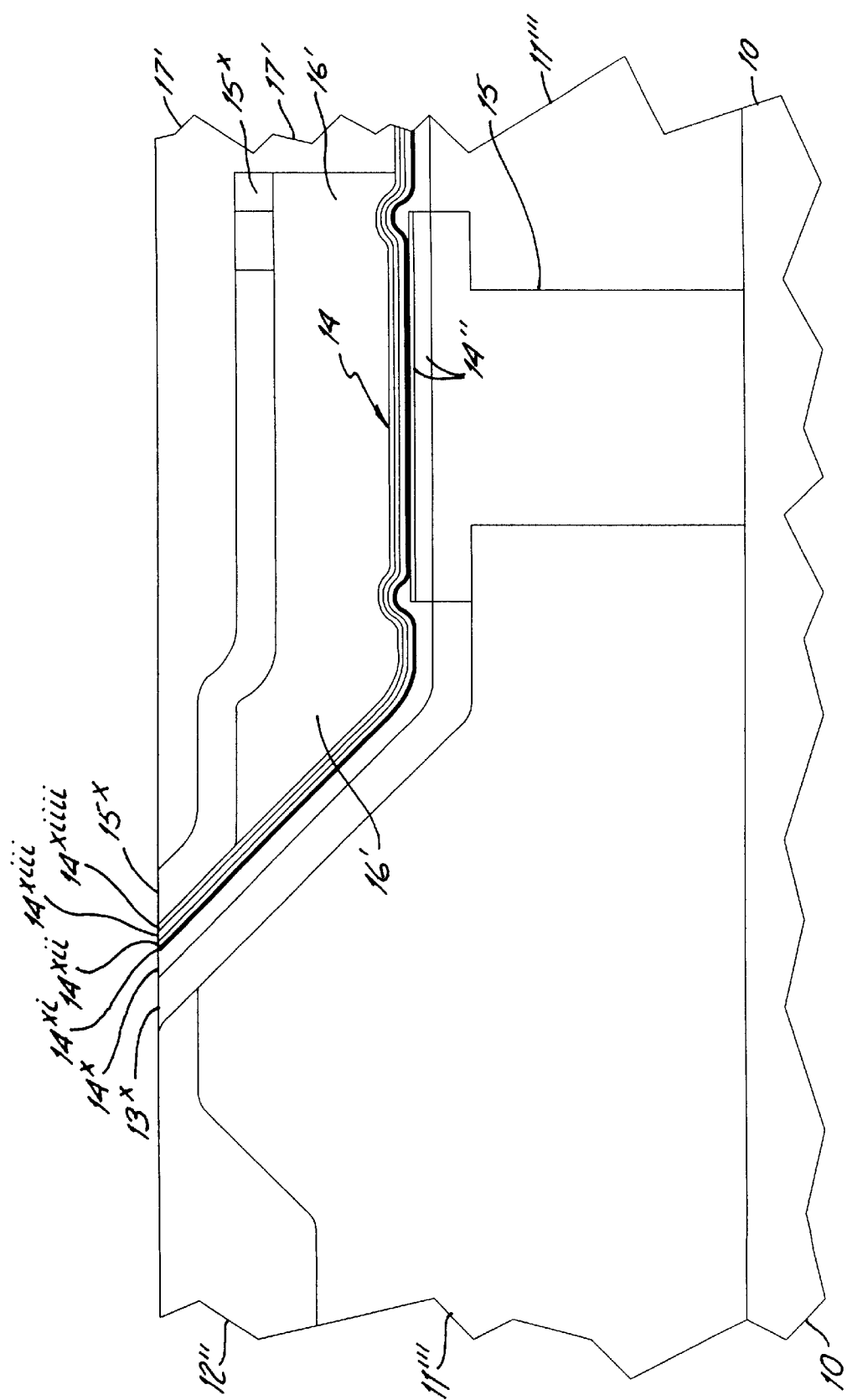

The structure of FIG. 16 is then lapped to mechanically remove material down to the surface of Sendust layer 12" followed by chemical mechanical polishing with the results shown in FIG. 17. As a result of the lapping mechanical removal of material, insulating layer 13' of FIG. 16 is redesignated 13$^x$ in FIG. 17, silicon nitride layer 14''' of FIG. 16 is redesignated 14$^x$ in FIG. 17, aluminum oxide barrier 14"" of FIG. 16 is redesignated 14$^{xi}$ in FIG. 17, second ferromagnetic layer 14$^v$ of FIG. 16 is redesignated 14$^{xii}$ in FIG. 17, gap forming layer 14$^{vi}$ of FIG. 16 is redesignated 14$^{xiii}$ in FIG. 17, and third ferromagnetic layer 14$^{vii}$ of FIG. 16 is redesignated 14$^{xiiii}$ in FIG. 17, metal and front interconnection layer 15' of FIG. 16 is redesignated 15$^x$ in FIG. 17, and Sendust layer 17 of FIG. 16 is redesignated 17' in FIG. 17 as before. As can be seen, metal layer 15$^x$ becomes a front interconnection contact to flux guides 14$^{xii}$ and 14$^{xiiii}$ and so to sensing structure 14 along with bottom interconnection contact 15 thereto. The resulting exposed surface 18 of the device after lapping and polishing will be the air bearing surface in operation (which can again be covered by a very thin layer of diamond-like carbon for wear protection) which is common to all of the sensing structures and paired pole structures fabricated simultaneously with sensing structure 14 and pole structures 12" and 17', a surface which again is parallel to the major surfaces of semiconductor chip portion 10 and insulating layer 11 supporting these poles and sensing structures.

Figure 18:
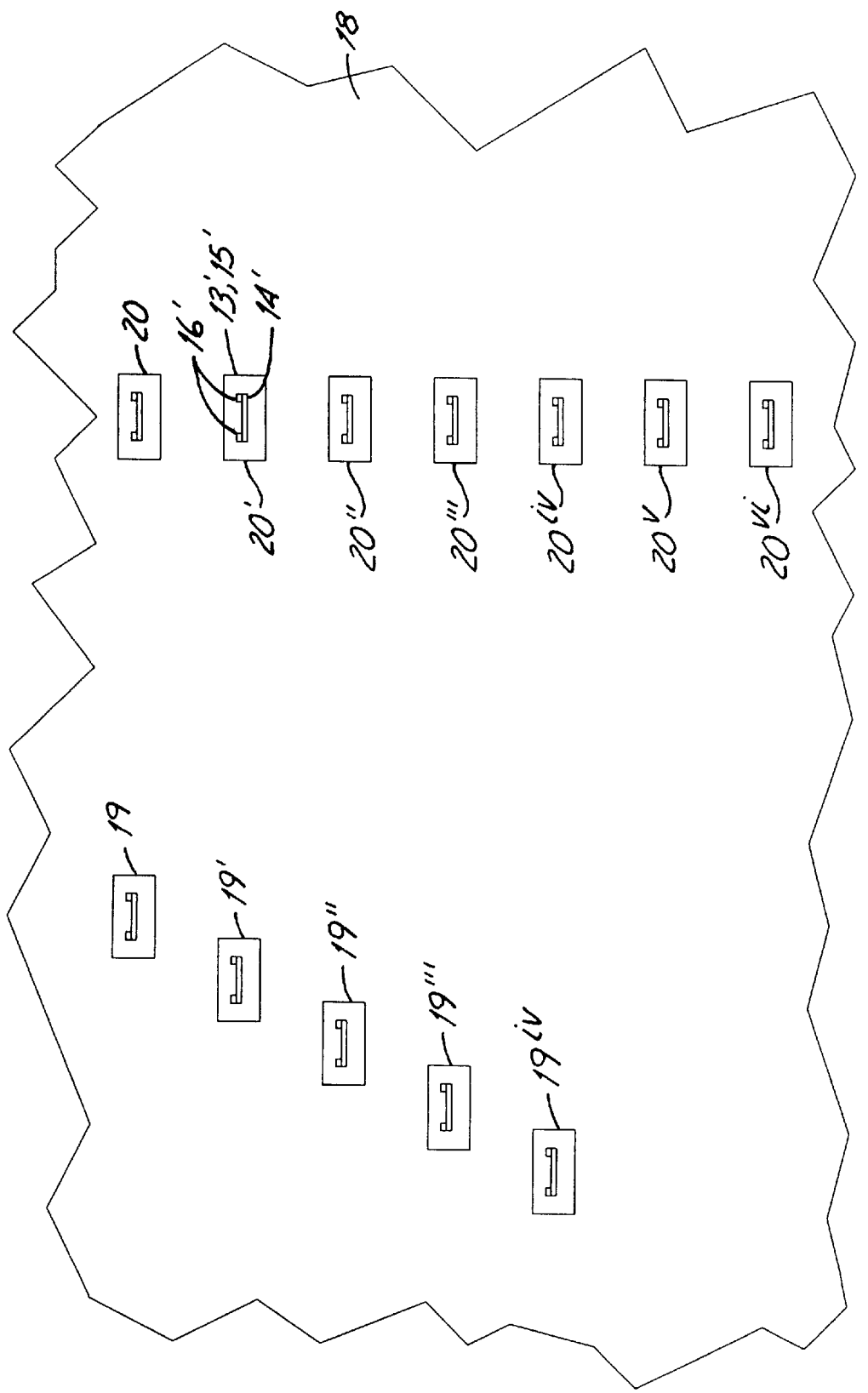
FIGS. 18 through 20 show portions of devices embodying the present invention in various configurations.

FIG. 18 shows a plan view of air bearing surface 18 as it might result from fabricating "read head" structures like the one shown in FIG. 9 although they could just as well instead be "read head" structures like the ones shown in FIG. 14 or 17. The magnetic media in operation would be moving past surface 18 in FIG. 18 from top to bottom, or vice versa. Not only can a pair of separate sensing structures, 19 and 20, each formed in the manner shown in FIG. 9, be provided side by side to each be over an adjacent data track in the magnetic medium moving thereby, multiple structures for sensing along such tracks can also be provided.

Thus, separate sensing structures or read heads, 20', 20", 20''', 20$^{iv}$, 20$^v$ and 20$^{vi}$, can be provided directly in line with sensing structure 20 along the track path thereby so that each can sense directly over a single data track passing under each of them and head 20. Processing the results from each of these individual heads by adding their sensed signals together after a suitable time delay in each with respect to the preceding one will give a composite signal result having a larger signal-to-noise ratio since some of the noise from each head will cancel while all of the signals will add.

Figure 19:
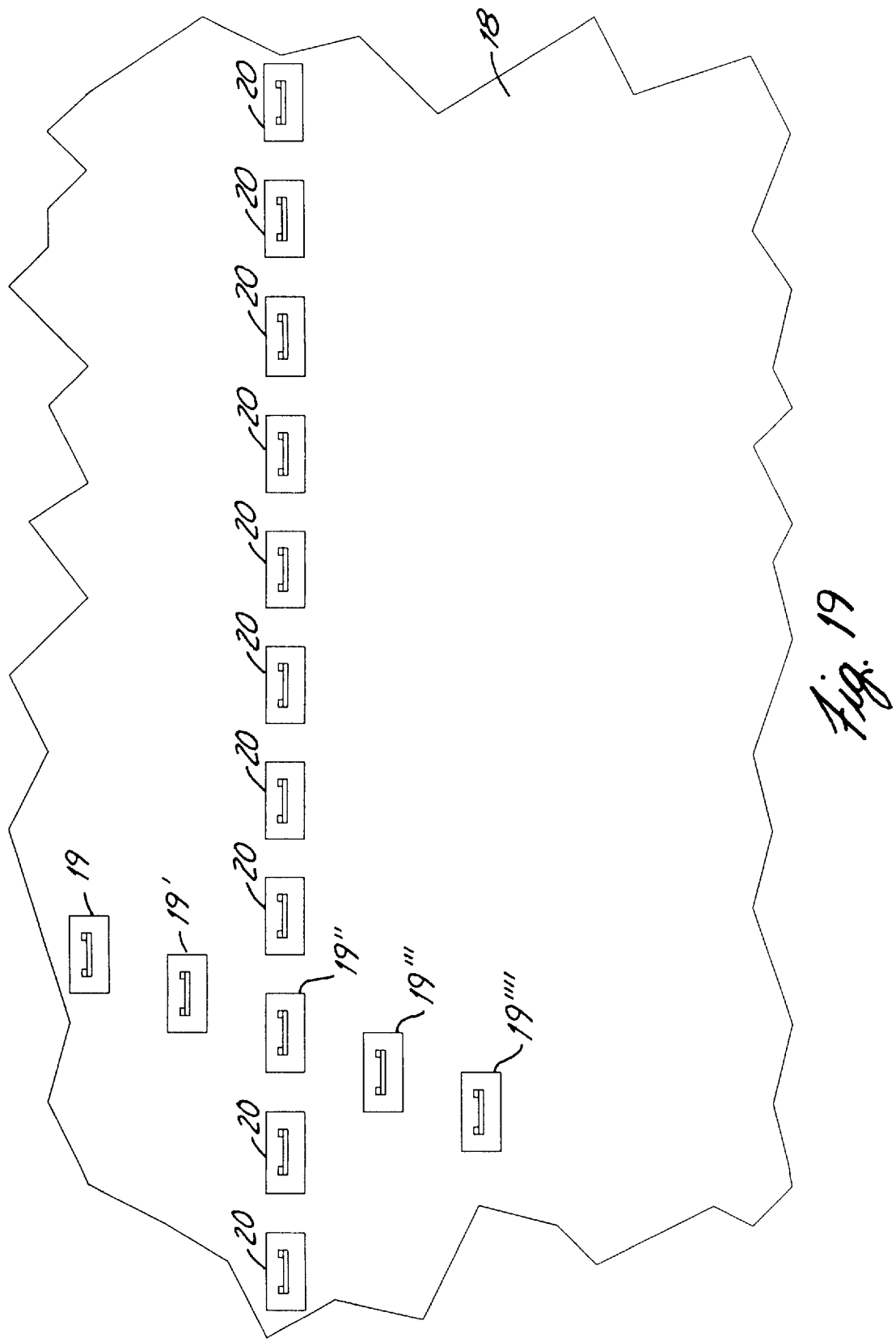
Figure 20:
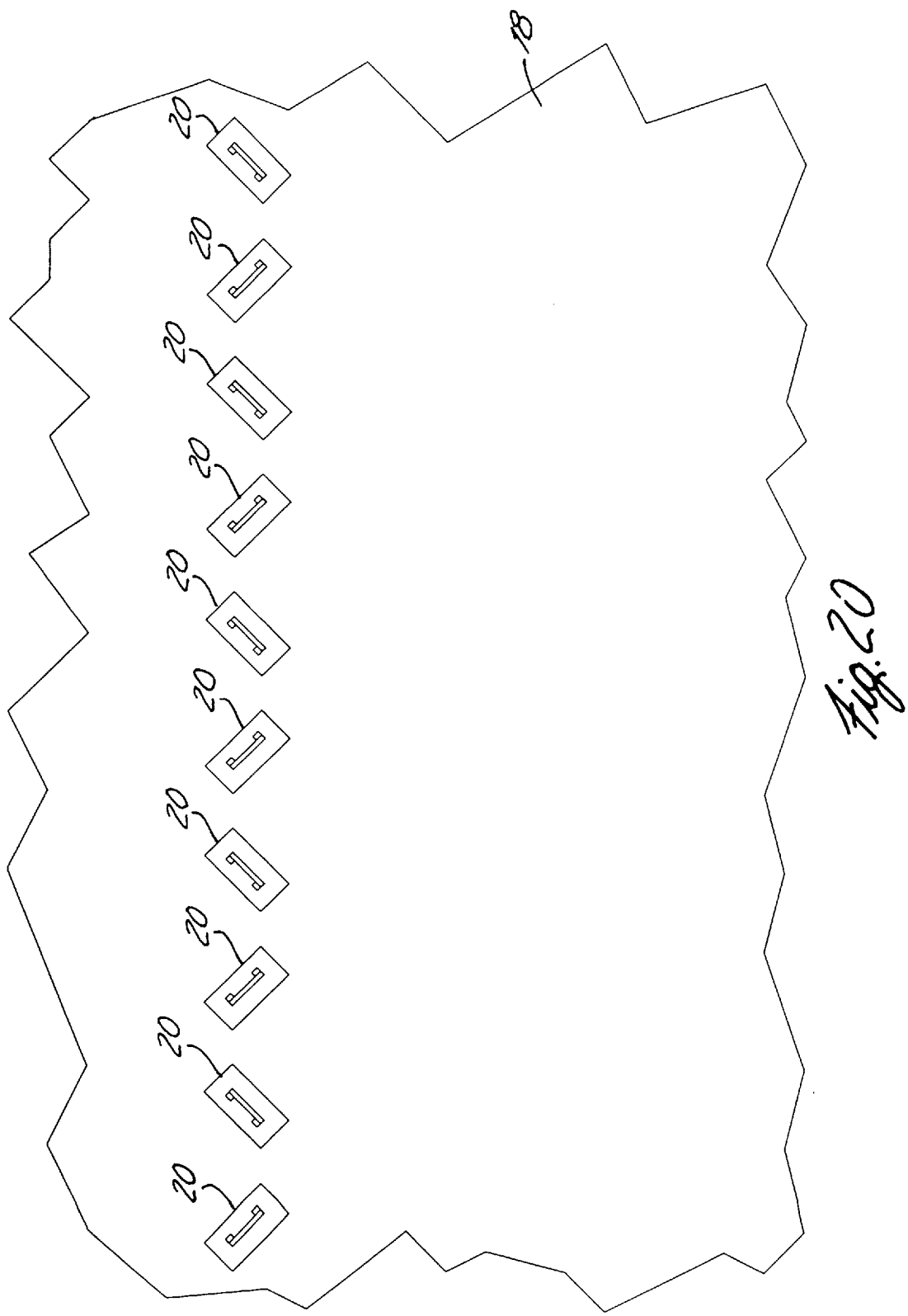

Similarly, to aid in maintaining the position of a read head over a data track, several sensing structures or read heads, 19', 19", 19''' and 19$^{iv}$, can be used with head 19, but rather than being in line therewith along a track path through that head, each is offset perpendicular to that track path from the preceding head in the string. As a result, a substantial portion on each side of a head positioning track in the magnetic medium moving thereby (which may be concentric with data tracks on one or both sides thereof also moving by as shown in FIG. 19) passes under these heads to thereby provide position error signals from one or more of the other heads in the set whenever the data track is following a path that is offset from the center one of this set of these offset read heads, here head 19". Alternatively, fluctuating path deviations can be measured in this set of offset read heads with the head signals combined after suitable delays so as to get a full track signal even though there are fluctuations of a data track from following a data track path passing by the center head this set. Further, as shown in FIG. 20, a set of separate sensing structures or read heads 20 otherwise in a line across adjacent tracks can each be rotated at an angle with respect to that line and so moved closer together along that line to permit even closer positioned tracks in the magnetic media moving thereby for greater track density in that media (which can also be provided by the arrangement of sensing structures or read heads, 19', 19'', 19''' and 19$^{iv}$ shown in FIG. 18).

Figure 21:
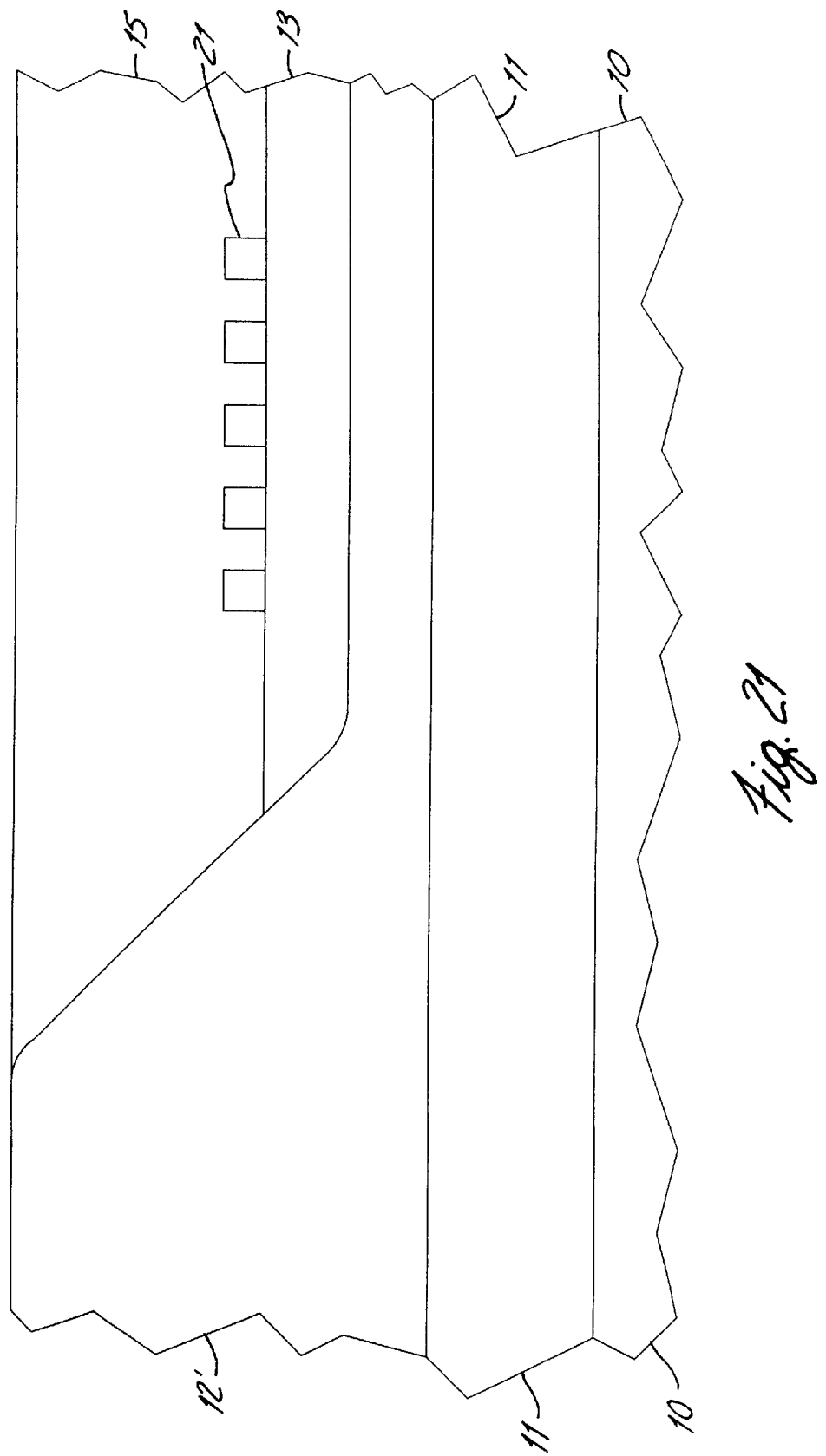
FIGS. 21 through 23 show portions of the results of fabrication steps for forming a device embodying the present invention.

Write heads can be provided in the same monolithic integrated circuit arrangement in which the read heads shown in FIGS. 4 and 9 are provided. Thus, from the structure of FIG. 6, Sendust layer 12 is shown in FIG. 21 of a thickness of 4 to 7 $\mu$m having a opening provided therein, through masking and ion milling, that does not go all the way down to insulating layer 11 but instead leaves a Sendust material bottom of 2 $\mu$m and a 45° slant wall. Sendust layer 12 of FIG. 1 is redesignated 12' in FIG. 21. Insulating layer 13 provided of silicon nitride over the bottom of the opening in Sendust layer 12' to a thickness of 1 $\mu$m as is also shown in FIG. 21. A planar inductive coil, 21, formed of copper to a thickness of 1 to 2 $\mu$m is formed on the surface of insulating layer 13 with appropriate interconnections through insulating layer 13, Sendust layer 12', insulating layer 11 and the protective passivation layer over integrated circuit 10 to the circuits in chip 10 for providing the currents through coil 21 representing the data to be stored in magnetic medium moving by the chip. Coil 21 is covered by silicon nitride insulating layer 15 in FIG. 21 to nearly the upper surface of Sendust layer 12'.

Figure 22:
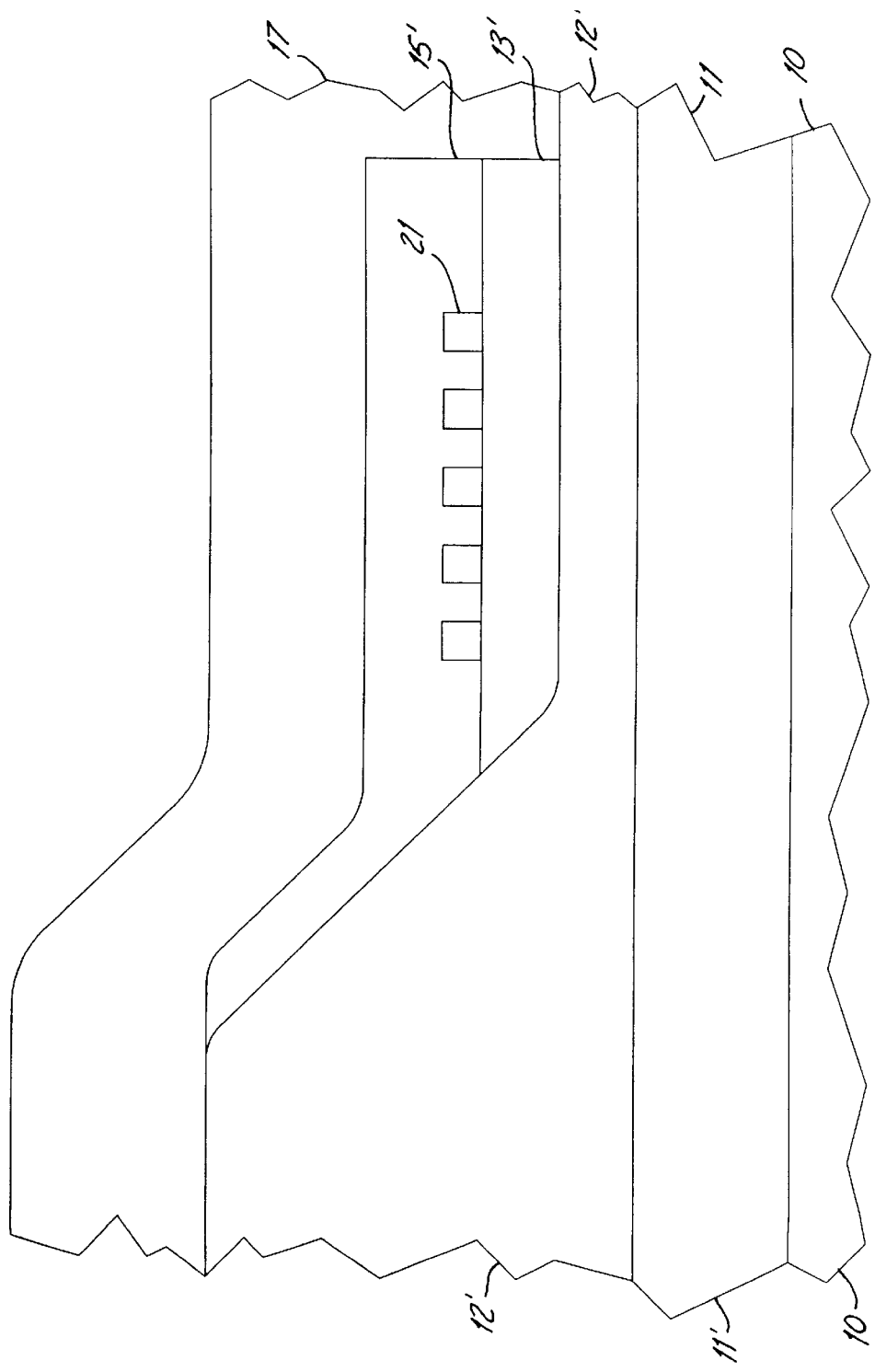

Thereafter, insulating layers 15 and 13 are shaped by masking and ion milling as shown in FIG. 22 reducing the thickness of layer 15 over coil 21 to around 1 $\mu$m, and leaving a portion thereof on the upper part of the 45° slant wall of Sendust layer 12' having a thickness of 0.1 $\mu$m perpendicular to that wall. Sendust layer 17 is then formed over the resulting shaped structure of insulating layers containing coil 21 to a thickness of around 2 $\mu$m. Insulating layer 13 of FIG. 21 is redesignated 13' in FIG. 22 and insulating layer 15 of FIG. 21 is redesignated 15' in FIG. 22.

Figure 23:
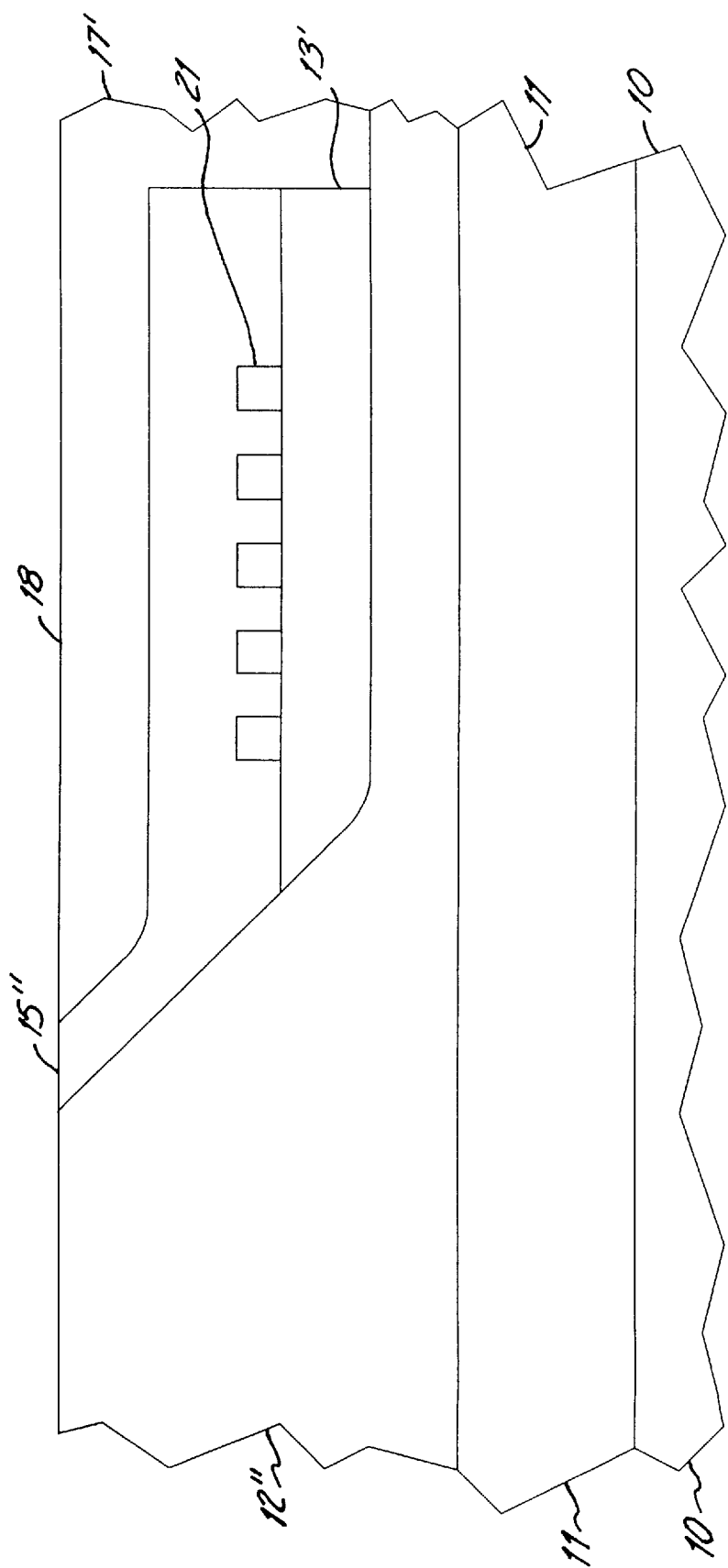

Once again, lapping is used to mechanically remove surface materials to result in the structure shown in FIG. 23 with surface 18 resulting from the lapping and the subsequent chemical mechanical polishing being the air bearing surface. Sendust layer 12' of FIG. 22 is redesignated 12'' in FIG. 23 with a remaining thickness of 4 to 7 $\mu$m, and insulating layer 15' of FIG. 22 is redesignated 15'' in FIG. 23, and finally Sendust layer 17 of FIG. 22 is redesignated 17' in FIG. 23 with a remaining thickness of 1 to 2 $\mu$m. The resulting structure provides a flux concentration gap about layer 15'' where it occurs narrowly between Sendust layers 12'' and 17'. Except for this gap, coil 21 is surrounded by Sendust on all sides to concentrate the flux induced by currents therethrough in this gap to result in a flux field extending outward from this gap at air bearing surface 18.

Although the present invention has been described with reference to preferred embodiments, workers skilled in the art will recognize that changes may be made in form and detail without departing from the spirit and scope of the invention.

What is claimed is:

1. A plurality of magnetic field sensors in a multiple sensor structure having a substrate, said magnetic field sensors providing at corresponding outputs thereof representations of magnetic field changes provided therein from a corresponding source of such magnetic field changes, said sensor structure comprising:

a plurality of paired pole structures supported on said substrate with each of those pole structures in a said paired pole structure being spaced apart from one another to form a corresponding gap space therebetween and with each of said pole structures comprising a permeable material and having an end thereof substantially in a common surface; and a plurality of field sensing structures each supported on said substrate adjacent a corresponding paired pole structure with at least a portion thereof positioned away from said common surface, each of said plurality field sensing structures being formed of a plurality of magnetoresistive, anisotropic, ferromagnetic thin-film layers at least two of which are separated from one another by a nonmagnetic layer positioned therebetween.

2. The apparatus of claim 1 wherein said substrate includes a monolithic integrated circuit with circuit interconnections being provided coupling electrical circuits in said monolithic integrated circuit to each of said plurality of field sensing structures.

3. The apparatus of claim 1 wherein said common surface is a surface of said sensor structure substantially perpendicular to a major surface of said substrate on which said plurality of paired pole structures and said plurality of field sensing structures are supported.

4. The apparatus of claim 1 wherein said common surface is a surface of said sensor structure substantially parallel to a major surface of said substrate on which said plurality of paired pole structures and said plurality of field sensing structures are supported.

5. The apparatus of claim 1 wherein each of said plurality of field sensing structures is supported in said gap space of said corresponding paired pole structure and each has said nonmagnetic layer thereof formed of an electrically conductive material and positioned between said two ferromagnetic thin-film layers thereof which each extend to said common surface.

6. The apparatus of claim 1 wherein each of said plurality of field sensing structures has one of said two ferromagnetic thin-film layers thereof extend to said common surface and each has said nonmagnetic layer thereof formed of an electrically insulative material and positioned between said two ferromagnetic thin-film layers thereof.

7. The apparatus of claim 1 wherein said pair of pole structures in a said paired pole structure are relatively closely spaced apart from one another adjacent said common surface but are relatively distantly spaced apart from one another elsewhere along said corresponding field sensing structure.

8. The apparatus of claim 1 further comprising a storing paired pole structure supported on said substrate with each of those pole structures in said storing paired pole structure being spaced apart from one another to form a corresponding storing gap space therebetween and with each of said pole structures comprising a permeable material and having a portion thereof substantially in said common surface, said storing paired pole structure having a coiled electrical conductor provided in said storing gap space away from said common surface supported on a surface parallel to said common surface.

9. The apparatus of claim 2 wherein said electrical circuits contain an electronic signal amplifier.

10. The apparatus of claim 3 wherein at least one of said plurality of field sensing structures has one of said two ferromagnetic thin-film layers thereof extend to said common surface following a straight line path.

11. The apparatus of claim 4 at least one of said plurality of field sensing structures has one of said two ferromagnetic thin-film layers thereof extend to said common surface following a path other than a straight line path.

12. The apparatus of claim 4 at least one of said plurality of field sensing structures has said two ferromagnetic thin-film layers thereof extend to said common surface following a path other than a straight line path.

13. The apparatus of claim 4 wherein at least one of said plurality of paired pole structures can have a selected line in said common surface intersect both of its pole structures so that others of said plurality of paired pole structures each have both of its pole structures intersect such a line.

14. The apparatus of claim 4 wherein at least one of said plurality of paired pole structures can have a selected line in said common surface intersect both of its pole structures so that others of said plurality of paired pole structures each have both of its pole structures laterally offset from such a line.

15. The apparatus of claim 4 wherein at least one of said plurality of paired pole structures can have a selected first line in said common surface intersect both of its pole structures to form a first intersection so that others of said plurality of paired pole structures each have both of its pole structures laterally offset from such a first line, and each of said plurality of paired pole structures can also have a selected correspondence line in said common surface parallel to said selected first line intersect both of its pole structures at least one of which forms an intersection at an angle differing from that in said first intersection.

16. The apparatus of claim 8 wherein said pair of pole structures in a said storing paired pole structure are relatively closely spaced apart from one another adjacent said common surface but are relatively distantly spaced apart from one another elsewhere adjacent said coiled electrical conductor.

17. A plurality of magnetic field sensors in a multiple sensor structure having a substrate, said magnetic field sensors providing at corresponding outputs thereof representations of magnetic field changes provided therein from a corresponding source of such magnetic field changes, said sensor structure comprising:

at least one paired pole structure supported on said substrate with each of those pole structures in said paired pole structure being spaced apart from one another to form a corresponding gap space therebetween and with each of said pole structures comprising a permeable material and having an end thereof substantially in a common surface; and a plurality of field sensing structures each supported on said substrate adjacent a corresponding paired pole structure with at least a portion thereof positioned away from said common surface, each of said plurality field sensing structures being formed of a plurality of magnetoresistive, anisotropic, ferromagnetic thin-film layers at least two of which are separated from one another by a nonmagnetic layer positioned therebetween.

18. The apparatus of claim 17 wherein said substrate includes a monolithic integrated circuit with circuit interconnections being provided coupling electrical circuits in said monolithic integrated circuit to each of said plurality of field sensing structures.

19. The apparatus of claim 17 wherein said common surface is a surface of said sensor structure substantially perpendicular to a major surface of said substrate on which said plurality of paired pole structures and said plurality of field sensing structures are supported.

20. The apparatus of claim 17 wherein said common surface is a surface of said sensor structure substantially parallel to a major surface of said substrate on which said plurality of paired pole structures and said plurality of field sensing structures are supported.

21. The apparatus of claim 17 wherein said paired pole structure is one of a plurality of such paired pole structures and wherein each of said plurality of field sensing structures is supported in said gap space of said corresponding paired pole structure and each has said nonmagnetic layer thereof formed of an electrically conductive material and positioned between said two ferromagnetic thin-film layers thereof which each extend to said common surface.

22. The apparatus of claim 17 wherein said paired pole structure is one of a plurality of such paired pole structures and wherein each of said plurality of field sensing structures has one of said two ferromagnetic thin-film layers thereof extend to said common surface and each has said nonmagnetic layer thereof formed of an electrically insulative material and positioned between said two ferromagnetic thin-film layers thereof.

23. The apparatus of claim 17 wherein said pair of pole structures in said paired pole structure are relatively closely spaced apart from one another adjacent said common surface but are relatively distantly spaced apart from one another elsewhere along said corresponding field sensing structure.

24. The apparatus of claim 17 further comprising a storing paired pole structure supported on said substrate with each of those pole structures in said storing paired pole structure being spaced apart from one another to form a corresponding storing gap space therebetween and with each of said pole structures comprising a permeable material and having a portion thereof substantially in said common surface, said storing paired pole structure having a coiled electrical conductor provided in said storing gap space away from said common surface supported on a surface parallel to said common surface.

25. The apparatus of claim 18 wherein said electrical circuits contain an electronic signal amplifier.

26. The apparatus of claim 19 wherein at least one of said plurality of field sensing structures has one of said two ferromagnetic thin-film layers thereof extend to said common surface following a straight line path.

27. The apparatus of claim 20 at least one of said plurality of field sensing structures has one of said two ferromagnetic thin-film layers thereof extend to said common surface following a path other than a straight line path.

28. The apparatus of claim 20 at least one of said plurality of field sensing structures has said two ferromagnetic thin-film layers thereof extend to said common surface following a path other than a straight line path.

29. The apparatus of claim 20 wherein at least one of said plurality of paired pole structures can have a selected line in said common surface intersect both of its pole structures so that others of said plurality of paired pole structures each have both of its pole structures intersect such a line.

30. The apparatus of claim 20 wherein at least one of said plurality of paired pole structures can have a selected line in said common surface intersect both of its pole structures so that others of said plurality of paired pole structures each have both of its pole structures laterally offset from such a line.

31. The apparatus of claim 20 wherein at least one of said plurality of paired pole structures can have a selected first line in said common surface intersect both of its pole structures to form a first intersection so that others of said plurality of paired pole structures each have both of its pole structures laterally offset from such a first line, and each of said plurality of paired pole structures can also have a selected correspondence line in said common surface parallel to said selected first line intersect both of its pole structures at least one of which forms an intersection at an angle differing from that in said first intersection.

32. The apparatus of claim 24 wherein said pair of pole structures in a said storing paired pole structure are relatively closely spaced apart from one another adjacent said common surface but are relatively distantly spaced apart from one another elsewhere adjacent said coiled electrical conductor.

33. A method for fabricating a magnetic field sensor in a sensor structure on a substrate, said method comprising:

providing an initial permeable material layer on a surface of said substrate having an opening therein with an angled side formed at an angle with respect to said substrate surface;

providing an initial nonmagnetic material layer supported by said initial permeable material layer including supported by said angled side thereof;

providing a device permeable material layer supported by at least one of said initial nonmagnetic material layer and an electrical interconnection extending therethrough, said device permeable material layer at least in part to be a portion of a magnetic sensing structure;

providing a device nonmagnetic material layer on said device permeable material layer which is at least in part to be a portion of a magnetic sensing structure;

providing a completion permeable material layer on said nonmagnetic material layer which is at least in part to be a portion of a magnetic sensing structure, at least one of said device permeable material layer and said completion permeable material layer also being provided across from said angled side; and removing portions of at least said initial nonmagnetic material layer and at least one of said device permeable material layer and said completion permeable material layer to form a common surface intersected by such layers which common surface intersects at least a portion of said angled side.

34. The method of claim 33 further providing a subsequent nonmagnetic material layer supported by at least a portion of said completion permeable material layer and thereafter providing an electrically conductive layer on said subsequent nonmagnetic material layer and also across from a portion of said completion permeable material layer.

35. The method of claim 34 wherein said electrically conductive layer is also provided at a location across from a portion of at least one of said device permeable material layer and said completion permeable material layer without also being across from said subsequent nonmagnetic material layer but being across from said angled side.

* * * * *